ated under 35

(12) United States Patent  (10) Patent No.: US 7,532,507 B2
Hayakawa  (45) Date of Patent: May 12, 2009

(54) PHASE CHANGE MEMORY DEVICE AND METHOD FOR MANUFACTURING PHASE CHANGE MEMORY DEVICE

(75) Inventor: Tsutomu Hayakawa, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 88 days.

(21) Appl. No.: 11/623,657

(22) Filed: Jan. 16, 2007

(65) Prior Publication Data

US 2007/0165452 A1  Jul. 19, 2007

(30) Foreign Application Priority Data

Jan. 17, 2006  (JP) .............................. 2006-008273

(51) Int. Cl.
    *G11C 11/00* (2006.01)
(52) U.S. Cl. ...................................................... 365/163
(58) Field of Classification Search ................ 365/148, 365/163; 257/2–5; 438/95, 96, 365
    See application file for complete search history.

(56) References Cited

U.S. PATENT DOCUMENTS

2004/0202017 A1* 10/2004 Lee ............................. 365/163
2007/0114671 A1*  5/2007 Hsu et al. .................... 257/774

FOREIGN PATENT DOCUMENTS

JP  2004-349504 A  12/2004
JP  2005-244235 A   9/2005

* cited by examiner

*Primary Examiner*—Richard Elms
*Assistant Examiner*—Harry W Byrne
(74) *Attorney, Agent, or Firm*—Sughrue Mion, PLLC

(57) ABSTRACT

A composite plug 104 is formed, and both a first plug (TiN) 106 and a second plug (W) 108 are disposed in one contact hole; the first plug (TiN) 106 functions as a heater electrode and the second plug (W) 108 functions as a contact plug. This eliminates the need to stack the heater electrode on the contact plug. The resistivities R11 and R12 of the first and second plugs of the composite plug 104 are in a relationship R11>R12.

26 Claims, 30 Drawing Sheets

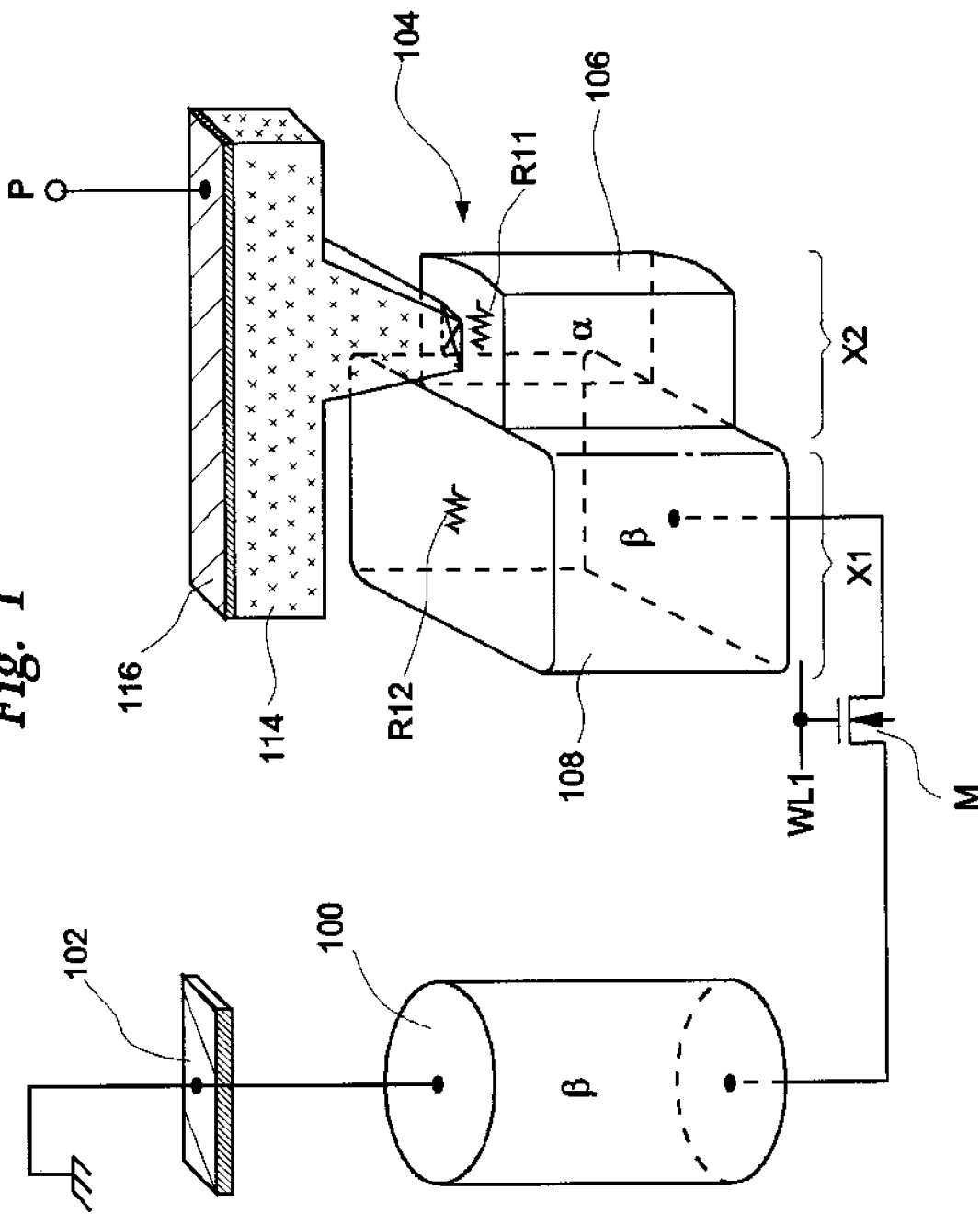

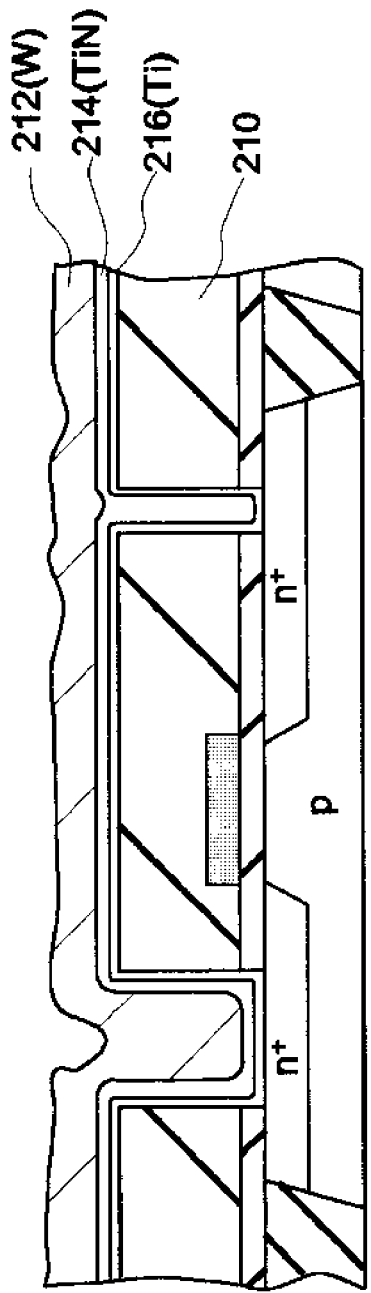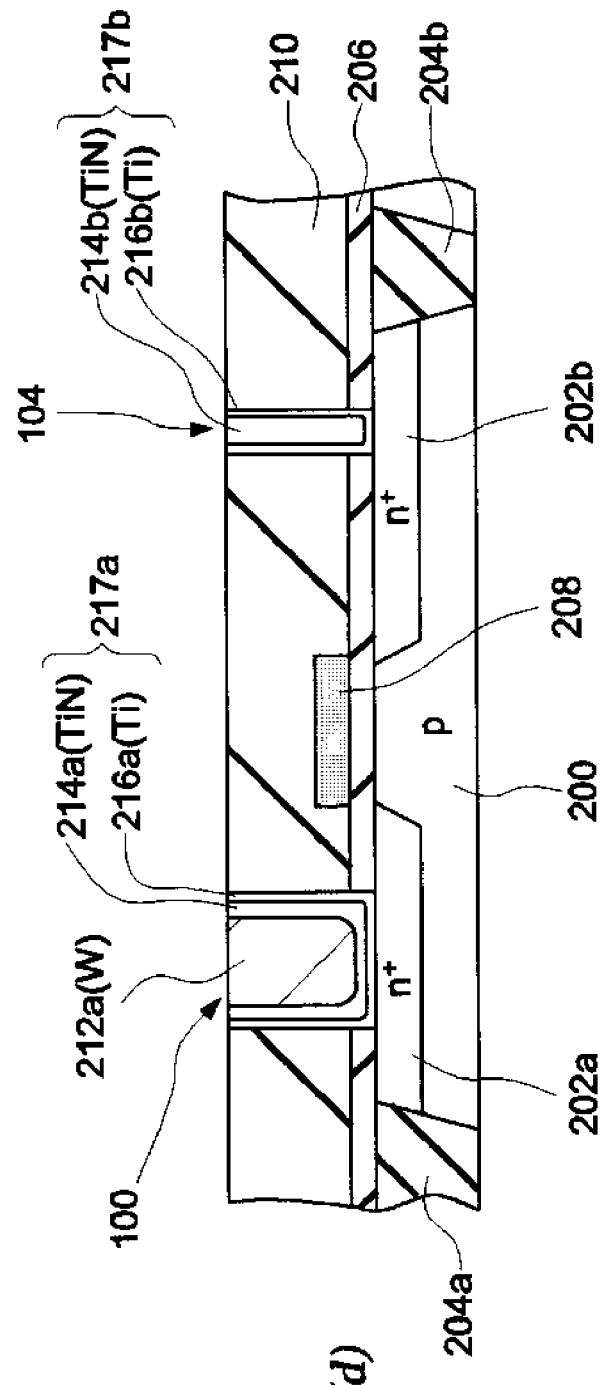

*Fig. 23*

|   | IV | V | VI | VII |
|---|----|----|----|-----|
| 1 |    |    |    |     |
| 2 |    |    | O  |     |
| 3 | Si | P  | S  | Cl  |
| 4 | Ge | As | Se | Br  |
| 5 | Sn | Sb | Te | I   |

PHASE CHANGE MEMORY DEVICE AND METHOD FOR MANUFACTURING PHASE CHANGE MEMORY DEVICE

BACKGROUND OF THE INVENTION

1. Field of the Invention

The present invention relates to a phase change memory device and a method for manufacturing a phase change memory device.

2. Related Art

A phase change memory device is a device having, as a memory cell, a phase change layer (chalcogenide semiconductor thin film or the like) offering electric resistance that changes depending on a crystalline state. The chalcogenide semiconductor is an amorphous semiconductor comprising a chalcogen element.

FIG. 23 is a diagram showing a part of a periodic table that is useful for describing chalcogen elements.

As shown in the figure, the chalcogen elements include S (sulfur), Se (selenium), and Te (tellurium), which belong to the VI-group elements. The applications of chalcogenide semiconductors are roughly classified into optical disks and electric memories. Known examples of the chalcogenide semiconductor used in the field of electric memories include GeSbTe (hereinafter referred to as GST), which is a compound of Ge (germanium), Te (tellurium), and Sb (antimony), AsSbTe, and SeSbTe.

FIGS. 24(a) and 24(b) are diagrams useful for explaining the principle of a phase change memory.

As shown in FIG. 24(a), the chalcogenide semiconductor can take on two stable states, non-crystalline state 10 and crystalline state 30. Transferring from non-crystalline state 10 to crystalline state 30 requires the supply of heat exceeding energy barrier 20.

As shown in FIG. 24(b), the non-crystalline state offers a high resistance, which is associated with a digital value "1". The crystalline state offers a low resistance, which is associated with a digital value "0". This enables digital information to be stored. Then, detecting a difference in the quantity of a current (or voltage drop) flowing via the chalcogenide semiconductor makes it possible to determine whether the stored information is "1" or "0".

Joule heat is supplied to change the phase of the chalcogenide semiconductor. That is, the chalcogenide semiconductor is supplied with pulses having different peak values and different time widths to generate Joule heat in the vicinity of the interface between an electrode and the chalcogenide semiconductor. This Joule heat causes a phase change.

Specifically, the chalcogenide semiconductor is supplied with heat at a temperature close to its melting point for a short time and then rapidly cooled to become non-crystalline. On the other hand, the chalcogenide semiconductor is supplied with heat at a crystallization temperature lower than its melting point for a long time and is then cooled to become crystalline. For example, GST is supplied with heat at a temperature close to its melting point (about 610° C.) for a short time (1 to 10 ns) and then rapidly cooled (for about 1 ns) to become non-crystalline. On the other hand, GST is supplied with heat at a crystallization temperature (about 450° C.) for a long time (30 to 50 ns) and then cooled to become crystalline.

As shown in FIG. 24(b), transferring from the non-crystalline state to the crystalline state is called a "set" operation (crystallization process). The pulse applied to the chalcogenide semiconductor during the set operation is called a "set pulse". Here, the minimum temperature required for crystallization (crystallization temperature) is defined as $T_c$. The minimum time required for crystallization (crystallization time) is defined as $t_r$. On the contrary, transferring from the crystalline state to the non-crystalline state is called a "reset" operation (non-crystallization process). The pulse applied to the chalcogenide semiconductor during the reset operation is called a "reset pulse". The heat applied to the chalcogenide semiconductor during the reset operation is at a temperature close to melting point $T_m$. The chalcogenide semiconductor is rapidly cooled after being melted.

FIGS. 25(a) to 25(d) are diagrams useful for describing the basic structure as well as a set operation and a reset operation of the phase change memory device.

As shown in FIG. 25(a), the phase change memory device basically has a chalcogenide semiconductor layer (phase change layer) 46 sandwiched between an upper electrode 48 and a lower electrode 42. Reference symbol 40 denotes a substrate. Reference symbol 44 denotes an electric insulating film. Upper electrode 48 connects to a terminal P to which the set pulse or the like is applied. Lower electrode 42 is fixed to a ground (reference potential).

As shown in FIG. 25(b), the phase change memory device in FIG. 25(a) is equivalent to a resistor R1. As described above, the resistance value of resistor R1 depends on whether the chalcogenide semiconductor is non-crystalline or crystalline. As shown in the left of FIG. 25(b), the following are input to terminal P: a set pulse S1 having a peak value exceeding a threshold voltage $V_{th}$, a reset pulse S2 having a larger peak value and a smaller width than S1, and a read pulse having a peak value of less than threshold voltage $V_{th}$ and a larger width than S1. Here, reference symbol $V_{th}$ denotes the lower limit voltage at which Joule heat required for crystallization can be generated.

FIG. 25(c) shows the correspondence between set pulse S1 and a rise in temperature caused by Joule heat generated by the supply of set pulse S1. The upper diagram shows a voltage waveform and the lower diagram shows how the temperature is raised by the Joule heat.

Set pulse S1 has a voltage value exceeding the predetermined threshold voltage $V_{th}$ and a time width $t_{cry}$. Time width $t_{cry}$ is equal to or longer than crystallization time $t_r$, that is, the minimum time required to crystallize the chalcogenide semiconductor. The temperature reached under the effect of the Joule heat is considerably lower than melting point $T_m$ and higher than the minimum temperature required for crystallization (crystallization temperature) $T_c$.

Similarly, FIG. 25(d) shows the correspondence between reset pulse S2 and a rise in temperature caused by Joule heat generated by the supply of reset pulse S2. The upper diagram shows a voltage waveform and the lower diagram shows how the temperature is raised by the Joule heat.

As shown in the figure, reset pulse S2 has a peak value significantly exceeding threshold voltage $V_{th}$ for crystallization; the peak has a sufficient narrow width. The temperature reached under the effect of the Joule heat thus exceeds the melting point $T_m$ of the chalcogenide semiconductor. A time width $t_{amo}$ from the peak temperature until the crystallization temperature $T_c$ is sufficiently short. The chalcogenide semiconductor is thus melted and then rapidly cooled. As a result, the chalcogenide semiconductor returns to the non-crystalline state.

In the above description, a circuit scheme is used in which terminal P supplies set pulse S1 and reset pulse S2. However, such a circuit scheme as shown in FIG. 26 may be used.

FIG. 26 is a circuit diagram showing an example of a circuit scheme for the phase change memory device.

In FIG. 26, resistor R1 corresponds to the phase change memory device. Terminal P is connected to VDD (power-supply potential). Reference symbols M1 to M3 denote MOS transistors of an adjusted size. Reference symbols P1, P2, and P3 denote a set pulse terminal, a reset pulse terminal, and a read pulse terminal, respectively.

Terminals P1 to P3 are used to select which of MOS transistors M1 to M3 is to be turned on and to the time for which MOS transistors M1 to M3 are energized. This makes it possible to implement a set operation, a reset operation, and a read operation.

FIG. 27 is a circuit diagram useful for describing the read operation in the phase change memory device (phase change memory IC). In FIG. 27, the same components as those in FIG. 26 are denoted by the same reference symbols.

In FIG. 27, reference symbol W denotes a word line, reference symbol G denotes a ground line, and B denotes a bit line that is a pulse input line connected to terminal P to which set pulse S1, reset pulse S2, and read pulse S3 are input. Reference symbol R1 denotes the equivalent resistance of the phase change memory device comprising a chalcogenide semiconductor layer 60.

Reference symbol M4 denotes an NMOS transistor (switching element) for selecting a memory cell. Reference symbol R2 denotes a current/voltage converting resistor, and reference symbol A1 denotes a sense amplifier. Reference symbol 62 denotes a power-supply for supplying reference voltage to sense amplifier A1. Symbol $I_1$ denotes a current flowing through a memory cell during a read operation. Reference symbol $V_{out}$ denotes an output voltage (sensing output) from sense amplifier A1.

For a set operation (following description also applies to a reset operation and a read operation), word line W is set to an active level to turn on NMOS transistor M4. Subsequently, a required pulse (one of S1 to S3) is input to terminal P. For a read operation, read pulse S3 is input.

The resistance value of resistor R1 depends on whether chalcogenide semiconductor layer 60 comprised in a memory cell is non-crystalline or crystalline. The quantity of current I1 correspondingly varies. Accordingly, converting the current quantity into a voltage value and reading this value makes it possible to determine whether stored information is "1" or "0".

FIGS. 28(a) and 28(b) are sectional views showing an example of conventional structure of a memory cell portion of the phase change memory device (phase change memory IC).

In FIG. 28(a), n$^+$ layers 4a and 4b (source layer 4a and drain layer 4b) are formed in a p-type semiconductor substrate 2. A gate electrode 8 connected to word line W is disposed on a gate insulating film 6.

The n$^+$ layer (source layer) 4a is connected to the ground potential via a ground plug 11 and a ground interconnection 12 both consisting of a highly conductive material such as tungsten (W).

Contact plugs 14 and 16 are formed on the n$^+$ layer (drain layer) 4b. A heater electrode 18 is formed on contact plug 16.

The cross section area of heater electrode 18 is narrowed to increase current density so that Joule heat efficiently generates in a phase change region in a phase change layer 21.

Phase change layer 21 consisting of a chalcogenide semiconductor layer (GST or the like) is formed on heater electrode 18. Pulse input terminal P is connected to a top surface of phase change layer 21. Contact plugs 14 and 16 consist of, for example, tungsten (W). Heater electrode 18 consists of a high-resistance material, for example, titanium nitride (TiN). Contact plug 16 is interposed in order to prevent heat generated by heater electrode 18 from escaping to a semiconductor substrate.

The device in FIG. 28(a) has a 3-layer plug structure in which contact plugs 14, 16 and heater electrode 18 are stacked.

The basic configuration of the phase change memory shown in FIG. 28(b) is the same as that of the phase change memory device in FIG. 28(a). However, the phase change memory device in FIG. 28(b) has been eliminated contact plug 16, comprising tungsten (W). As a result, this phase change memory has a 2-layer plug structure in which contact plug 14 and heater electrode 18 are stacked.

A phase change memory having a 3-layer plug structure such as the one shown in FIG. 28(a) is described in, for example, Japanese Patent Laid-Open No. 2004-349504.

A phase change memory having a 2-layer plug structure such as the one shown in FIG. 28(b) is described in, for example, Japanese Patent Laid-Open No. 2005-244235.

The conventional phase change memory device requires at least 2-layer plug structure in which the contact plug and heater electrode are connected together. Completion of a memory cell in the phase change memory device requires more layers to be stacked.

That is, completion of a memory cell in the phase change memory device requires forming a phase change layer which is formed on the heater electrode, forming an upper electrode layer on the phase change layer, forming an interlayer insulating film on the phase change layer, forming a contact hole in the interlayer insulating film, burying a contact plug in the contact hole, and forming an electrode connected to the contact plug and corresponding to the bit line.

Consequently, the phase change memory device has a multilayer structure having at least three layers. This disadvantageously increases the size of the phase change memory device, complicates the device structure, and increases the number of manufacturing steps.

Connecting the plugs together so as to form multiple layers further increase the length of a current path, this thus causes an increased equivalent resistance.

Furthermore, the upper electrode comprising metal on the top surface of the phase change layer (chalcogenide layer) offers a high thermal conductivity and acts as a heat sink (radiating fin). This upper electrode thus allows Joule heat required for a phase change to escape. This correspondingly lowers the thermal efficiency of the phase change memory device. In other words, inhibiting the heat radiation from the upper electrode on the phase change layer enables the thermal efficiency of the phase change memory device to be improved.

SUMMARY OF THE INVENTION

The present invention is based on the above considerations. An object of the present invention is to improve the layer structure of each memory cell in a phase change memory device to achieve a reduction in the size of the phase change memory device, simplification of the structure, and a reduction in manufacturing steps, and to inhibit heat radiation from an upper electrode on a phase change layer to improve thermal efficiency as required, to enable the mass production of large-scale phase change memory devices.

The present invention provides a phase change memory device in which a current is passed through a current path composed of a conductor layer, a first contact plug connected to the conductor layer, a heater electrode connected to the contact plug, and a phase change layer connected to the heater electrode to generate Joule heat at an interface between the phase change layer and the heater electrode to change a phase of the phase change layer to write information, the phase change memory device comprising:

a first interlayer insulating film in which a first contact hole is formed; and a composite plug burried in the first contact hole, where the composite plug is composed of a first plug consisting of a first conductive material and acting as the heater electrode and a second plug consisting of a second conductive material having a lower resistivity than the first conductive material and acting as the first contact plug.

In this configuration, the composite plug consisting of the first and second plugs is formed in one contact hole, that is, a contact plug and a heater electrode are disposed in the same contact hole. The term "contact plug" as used herein refers to an "electrode (buried electrode) disposed in an electric insulating film to electrically connect one electronic circuit element to another electronic circuit element". The second plug functions as a contact plug (a first contact plug) that electrically connects the underlying conductor layer to the heater electrode (first plug) present by the side of the second plug and the overlying phase change layer. The term "heater electrode" refers to an "electrode that contacts the phase change layer to generate Joule heat required to cause a phase change in the phase change layer". In the present invention, the "heater electrode" is not independently formed but the first plug, constituting the composite plug, serves as the heater electrode. In this sense, the first plug can be called a "heater plug". The first plug functions not only as the heater plug but also as a contact plug. In other words, the first plug also serves to electrically connect the underlying conductor layer and second plug to the overlying phase change layer. The term "composite plug" refers to a "plug consisting of at least two different types of conductive materials that are electrically connected together so that the plugs can be considered to constitute one plug as a whole".

For the composite plug in accordance with the present invention, a first conductive material constituting the first plug acting as a heater electrode offers a high resistivity and efficiently generates heat when a current is passed through the material.

A second conductive material constituting the second plug acting as a contact plug is composed of a material with a low resistivity. The second plug sufficiently reduces the electric resistance of the composite plug as a whole. It has been considered to be reasonable to connect the components (CMOS transistors and the like) of a silicon-based LSI and phase change memory-specific components (heater electrode, phase change layer, and the like) together by stacking them in a vertical direction via contact plugs. However, contrary to this common wisdom, the present invention allows the first plug, constituting the composite plug, to serve as a heater electrode to provide a phase change memory device of an innovative structure. That is, although a heater electrode stacked on a contact plug has unavoidably resulted in a multilayer structure, the present invention enables the contact plug and heater electrode to be formed into a single layer structure. This simplifies the process of manufacturing a phase change memory device and reduces the size of the phase change memory device.

According to an aspect of the phase change memory device in accordance with the present invention, the first conductive material comprises a metal selected from titanium (Ti), tantalum (Ta), molybdenum (Mo), niobium (Nb), zirconium (Zr), and tungsten (W), or a nitride of the metal, or a silicide of the metal.

Each of the listed metal materials is a main component which can be used as the first conductive material constituting the heater electrode. Both electric conductivity (reciprocal of the resistivity) and thermal conductivity of all of these metal materials are lower than those of aluminum (Al) or copper (Cu), used in silicon-based LSIs. Some of these metal materials can be also used as the material of the second plug.

According to another aspect of the phase change memory device in accordance with the present invention, the first conductive material comprises any of titanium nitride (TiN), tantalum nitride (TaN), molybdenum nitride (MoN), niobium nitride, titanium-silicon nitride, titanium-aluminum nitride, titanium-boron nitride, zirconium-silicon nitride, tungsten-silicon nitride, tungsten-boron nitride, zirconium-aluminum nitride, molybdenum-silicon nitride, molybdenum-aluminum nitride, tantalum-silicon nitride, tantalum-aluminum-nitride, titanium oxynitride, titanium aluminum oxynitride, tungsten oxynitride, tantalum oxynitride, tantalum silicide (TaSi), tungsten silicide (WSi), or molybdenum silicide (MoSi).

Description has been given of examples of the first conductive material constituting the first plug acting as a heater electrode.

According to another aspect of the phase change memory device in accordance with the present invention, the second conductive material comprises metal selected from tungsten (W), aluminum (Al), molybdenum (Mo), and copper (Cu), or a silicide of the metal.

This aspect clarifies that the second conductive material constituting the second plug acting as a contact plug comprises at least one of the above components. These metal materials can essentially be used as ground electrodes or ground interconnections. However, some of these metal materials can be also used as the material of the first plug.

According to another aspect of the phase change memory device in accordance with the present invention, the resistivity of the first conductive material is preferably at least 10 times as high as that of the second conductive material.

A difference of 10 times or more in resistivity between the first conductive material and the second conductive material allows the first plug to efficiently generate heat, while allowing the second plug to reduce the electric resistance; the present invention is not limited to the difference of 10 times or more. The difference of about 10 times in resistivity can be realized without posing any problem by using TiN (titanium nitride) as a first conductive material and tungsten (W) as a second conductive material.

According to another aspect of the phase change memory device in accordance with the present invention, the volume of the second plug is larger than that of the first plug.

Increasing the volume of the second plug makes it possible to reduce the resistance of the composite contact plug as a whole.

According to another aspect of the phase change memory device in accordance with the present invention, a planar shape of the composite plug comprises a main body portion including the second plug and a protruding portion which protrudes from the main body portion and which has a narrower width than that of the main body portion, and which comprises the first plug.

This aspect specifies the planar shape of the composite plug, in other words, the planar shape of the first contact hole formed in the first interlayer insulting film and in which the first and second plugs are buried. That is, the first contact hole has the planar shape having the wide main body portion and the narrow protruding portion. The narrow protruding portion is completely filled with the first conductive material. The wide main body portion is filled with the first and second conductive materials. Adjustment of the width of planar pattern and the thicknesses of the thin films of the first and second conductive materials allows the composite plug to be easily formed simply by using a technique for filling a contact hole (CVD or the like). This is advantageous for the mass production of phase change memories.

According to another aspect of the phase change memory device in accordance with the present invention, the planar shape of the composite plug is side projection types such as P-shape and L-shape, center projection types such as T-shape and I-shape.

The planar shape of the composite plug (planar shape of the first contact hole formed in the first interlayer insulating film) of side or center projection type can be easily formed by changing the shape of a mask during the formation of a contact hole. This is advantageous for the mass production of phase change memories.

According to another aspect of the phase change memory device in accordance with the present invention, the first plug is formed by burying titanium nitride (TiN) on a thin titanium (Ti) film formed at sidewalls and bottom of the first contact hole put in the first interlayer insulating film, and the second plug is formed by filling tungsten (W) into a recessed portion remaining after burying the titanium nitride (TiN).

This aspect positively utilizes the fact that a narrow groove can be completely filled with a thin film of a predetermined film thickness but not a wide groove. The narrow groove is completely filled with titanium nitride (TiN), the first conductive material, to form a first plug. Then, the wide groove in which the recess remains is further filled with tungsten (W) to form a second plug. Adjustment of the planar pattern and width of the groove (contact hole) and the thicknesses of the thin films of the first and second conductive materials allows the composite plug to be easily formed simply by using a technique for filling a contact hole (CVD or the like). This is advantageous for the mass production of phase change memories.

According to another aspect of the phase change memory device in accordance with the present invention, a bottom surface of the phase change layer is in contact with a top surface of the first plug acting as the heater electrode of the composite plug, a lead electrode layer is disposed in contact with the bottom surface of the phase change layer at a position away from the interface between the first plug and the phase change layer, and a second contact plug is connected to the lead electrode layer, so that the second contact plug, the phase change layer, the first plug acting as the heater electrode, the second plug acting as the first contact plug, and the conductor layer form a current path.

This aspect improves thermal efficiency by adopting the structure having no electrode on the top surface of the phase change layer. In the above composite plug, the second conductive material acting as a first contact plug is present by the side of the first plug acting as a heater electrode. Heat generated by the first plug thus escapes to the second plug. This may slightly lower the thermal efficiency for a write operation, particularly for a reset operation. The structure having no electrode on the top surface of the phase change layer is thus adopted to inhibit heat radiation from the top surface of the phase change layer. This compensates for heat loss in the composite plug to prevent a fall in thermal efficiency. That is, an electrode present immediately above a phase change region of the phase change layer functions as heat sink to allow heat to escape; the phase change region is located in the vicinity of the interface between the first plug and the phase change layer. Accordingly, no electrode is disposed on the top surface of the phase change layer. Further, the lead electrode is contacted with the bottom surface of the phase change layer at the position away from the interface between the first plug and the phase change layer. Furthermore, the second contact plug is connected to the lead electrode to form a current path through which a current is passed through the phase change layer.

According to another aspect of the phase change memory device in accordance with the present invention, an insulating film (hereinafter referred to as a second insulating film) patterned so as to expose at least a part of the first plug of the composite plug is formed on the first interlayer insulating film in which the composite plug is buried, and the lead electrode layer with a predetermined pattern is formed on the second insulating film. The phase change layer is formed so as to cover a part of the lead electrode layer and the exposed first plug, an interlayer insulating film (hereinafter referred to as a third interlayer insulating film) is formed on the phase change layer, the third interlayer insulating film having a contact hole (hereinafter referred to as a second contact hole) exposing that part of a top surface of the lead electrode layer which is not covered with the phase change layer, and the second contact plug is formed in the second contact hole.

The above aspect clarifies the configuration of the layers in the device structure including the lead electrode. That is, the patterned insulating film is formed on the first interlayer insulating film in which the composite plug is buried, and the lead electrode is formed on the patterned insulating film at the predetermined position. The phase change layer is formed so as to cover the part of the lead electrode layer and the exposed first plug, the third interlayer insulating film is formed on the phase change layer, and the second contact plug is formed which is connected to the top surface of the lead electrode layer which is not covered with the phase change layer in a second contact hole in the third interlayer insulating film. This structure can be manufactured by an ordinary LSI manufacturing process without posing any problem.

According to another aspect of the phase change memory device in accordance with the present invention, the lead electrode layer comprises a main electrode layer and an adhesion layer formed on a surface of the main electrode layer to improve adhesion to the phase change layer.

The adhesion layer (titanium (Ti) or the like) on the main electrode layer (for example, a metal layer such as tungsten (W)), a component of the lead electrode layer, makes it possible to improve the adhesion between the phase change layer and the lead electrode layer. The adhesion layer does not contact the phase change region, in which a phase change occurs. This prevents the possible degradation of a refresh characteristic resulting from composition variations caused by the coupling of the components of the phase change layer and lead electrode layer in the phase changing region.

According to another aspect of the phase change memory device in accordance with the present invention, the phase change memory device further has a switching element for memory cell selection which is electrically connected to the second plug of the composite plug.

According to this aspect, one electrode of the switching device (insulated gate type field effect transistor (MOSFET), junction type FET, bipolar transistor, PN junction diode, Schottky barrier diode, or the like) for memory cell selection is electrically connected to the second plug constituting the composite plug. Consequently, turning on and off the switching device enables electricity to be fed to the phase change layer.

A method for manufacturing a composite plug in accordance with the present invention comprises:

a first step of selectively patterning a part of a first interlayer insulating film on a semiconductor substrate to form a first contact hole with a planar shape having a main body portion and a protruding portion which protrudes from the main body portion and which has a narrower width than that of the main body portion;

a second step of burying the first contact hole with a first conductive material under conditions that allow only the protruding portion to be completely filled and a recess to be remained in the main body portion, to form the first plug acting as a heater electrode; and a third step of burying the recess of the main body potion of the first contact hole with a second conductive material to form the second plug.

This aspect positively utilizes the fact that a narrow groove can be completely filled with a thin film of a predetermined film thickness but not a wide groove. The first contact hole having the wide main body portion and the narrow protruding portion articulated to the main body portion are formed. The narrow groove in the protruding portion is completely filled with titanium nitride (TiN), the first conductive material, to form a first plug. The wide groove in which a recess remains is filled with tungsten (W), the second conductive material, to form a second plug. Adjustment of the planar pattern and width of the groove (contact hole) and the thicknesses of the thin films of the first and second conductive materials allows the composite plug to be easily formed simply by using a technique for filling the contact hole (CVD or the like). This is advantageous for the mass production of phase change memories.

An aspect of a method for manufacturing a phase change memory device in accordance with the present invention comprises a first step (step A) of using the method for manufacturing a composite plug in accordance with the present invention to form the composite plug in the first contact hole in the first interlayer insulating film, and a second step (step B) of forming the phase change layer so that a bottom surface of the phase change layer contacts the first plug of the composite plug.

The conventional method places a heater electrode on a contact plug and forms a phase change layer on the heater electrode. However, the method for manufacturing in accordance with the present invention can form a phase change layer directly on the composite plug. This simplifies the manufacturing process and the layer structure, reducing the size of the phase change memory device.

Another aspect of the method for manufacturing a phase change memory device in accordance with the present invention comprises a first step (step A) of using the method for manufacturing a composite plug in accordance with the present invention to form the composite plug in the first contact hole in the first interlayer insulating film, a second step (step B) of forming a second insulating film on the first interlayer insulating film in which the composite plug is buried, a third step (step C) of forming a lead electrode layer on the second insulating film at a predetermined position, a fourth step (step D) of patterning the second insulating film so as to expose at least a part of the first plug of the composite plug, a fifth step (step E) of forming the phase change layer so as to cover a part of the lead electrode layer and the exposed first plug, a sixth step (step F) of forming a third interlayer insulating film on the phase change layer and patterning the third interlayer insulating film to form a second contact hole exposing that part of a top surface of the lead electrode layer which is not covered with the phase change layer, and a seventh step (step G) of burying and forming a second contact plug in the second contact hole.

This method makes it possible to manufacture a small phase change memory device having a simplified layer structure and offering an appropriate thermal efficiency, through the process of sequentially forming a composite plug, a second insulating film, and a lead electrode layer, patterning the second insulating film, sequentially forming a phase change layer and an third interlayer insulating film, patterning the third interlayer insulating film, and forming a second contact plug connected to the lead electrode layer.

Another aspect of the method for manufacturing a phase change memory device in accordance with the present invention comprises, before the first step (step A) of forming the composite plug, a step of forming a switching device for memory cell selection. Further, during the first step (step A) of forming the composite plug, a ground potential plug is formed for setting one electrode of the switching device to the ground potential.

According to this aspect, during the formation of a second plug acting as a first contact plug, a ground potential plug is also formed to allow both plugs to be formed suing the same manufacturing step. This enables a memory cell comprising the switching element to be easily and efficiently manufactured.

A heater electrode is conventionally stacked on a contact plug, unavoidably resulting in a multilayer structure. However, the present invention uses the composite plug to allow a contact plug and a heater electrode (heater plug) to be disposed in the same contact hole. This enables a contact plug and heater electrode to be formed into a single layer structure. This in turn simplifies the process of manufacturing a phase change memory device and reduces the size of the phase change memory device.

Increasing the volume of the second plug, constituting the composite plug, makes it possible to reduce the resistance of the composite contact plug as a whole.

The composite plug can be easily formed by changing a mask pattern to form a contact hole shaped to have a wide main body portion and a narrow protruding portion and consecutively filling the contact hole with different types of materials (for example, TiN and W) with the thickness of the resulting film adjusted; the contact hole is, for example, side projection types such as P-shape and L-shape, or center projection types such as T-shape and I-shape. This is advantageous for the mass production of phase change memories.

When the second plug, consisting of a highly conductive material, has a larger volume than the first plug, the electric resistance of the composite plug is dominantly determined by the second plug. This makes it possible to reduce the resistance value of the composite plug as a whole without affecting the operation of the circuit.

Preferably, there is a difference of about 10 times in resistivity between the first conductive material and the second conductive material. Such a difference can be substantially realized by using, for example, titanium nitride (TiN) as a first conductive material and tungsten (W) as a second material. Thus, the difference does not limit the selection of materials.

The present invention can also improve thermal efficiency by adopting a structure having no electrode on the top surface of the phase change layer and in which the lead electrode is contacted with the phase change layer. With the composite plug, the second conductive material acting as a contact plug is present by the side of the first plug acting as a heater electrode. Heat generated by the first plug thus escapes to the second plug. This may slightly lower the thermal efficiency for a refresh operation, particularly for a reset operation. The structure having no electrode acting as a heat sink on the top surface of the phase change layer is thus adopted to inhibit heat radiation from the top surface of the phase change layer.

This makes it possible to sufficiently compensate for heat loss in the composite plug, enabling the prevention of a fall in thermal efficiency.

To adopt the structure having no electrode on the top surface of the phase change layer, the lead electrode layer is contacted with the bottom surface of the phase change layer at the position away from the interface between the first plug and the phase change layer. The second contact plug is then connected to the lead electrode to form a current path through which a current is passed through the phase change layer. This structure can be manufactured by an ordinary LSI manufacturing process without posing any problem.

The adhesion between the phase change layer and the lead electrode layer can be improved by providing an adhesion layer (titanium (Ti) or the like) on the main electrode layer (for example, a metal layer of tungsten (W)), a component of the lead electrode layer. The adhesion layer does not contact the phase change region, in which a phase change occurs. This advantageously prevents the possible degradation of a refresh characteristic resulting from composition variations caused by the coupling of the components of the phase change layer and lead electrode layer in the phase changing area.

According to the present invention, adjustment of the planar pattern of the first contact hole, the width of the groove, and the thicknesses of the thin films of the first and second conductive materials allows the composite plug to be easily formed simply by using a technique for filling the first contact hole (CVD or the like).

The present invention is also able to manufacture large-scale phase change memory devices using a general-purpose manufacturing technique without the need to provide a special manufacturing process; the large-scale phase change memory devices is a phase change memory IC having a switching device for memory cell selection, a composite plug comprising a heater electrode, a phase change layer, and an electrode formed on the top surface of the phase change layer or a lead electrode and a second contact plug connected to the lead electrode.

The manufacturing steps can be reduced by simultaneously forming a composite plug and a ground potential plug during the same manufacturing process.

Using no special technique but only a general-purpose semiconductor manufacturing technique, the present invention can minimize the layer structure of each memory cell in a phase change memory device to achieve a reduction in the size of the phase change memory device, simplification of the structure, and a reduction in manufacturing steps. The present invention can further inhibit heat radiation from the upper electrode on the phase change layer to improve thermal efficiency as required. This enables the mass production of large-scale phase change memory devices.

BRIEF DESCRIPTION OF THE DRAWINGS

FIG. 1 is a diagram useful for describing the characteristic structure of a phase change memory device in accordance with the present invention;

FIGS. 4(a) to 4(d) are cross-sectional views useful for describing the respective steps of a method for manufacturing the structure of an essential part of the phase change memory device in FIG. 3;

FIG. 5(a) is a diagram showing a first side projection type (P-shaped type), FIG. 5(b) is a diagram showing a second side projection type (L-shaped type), FIG. 5(c) is a diagram showing a first center projection type (T-shaped type), and FIG. 5(d) is a second center projection type (I-shaped type);

FIG. 23 is a diagram useful for describing a chalcogen element, the view showing a part of a periodic teble;

DETAILED DESCRIPTION OF THE PREFERRED EMBODIMENTS

Figure 2A:
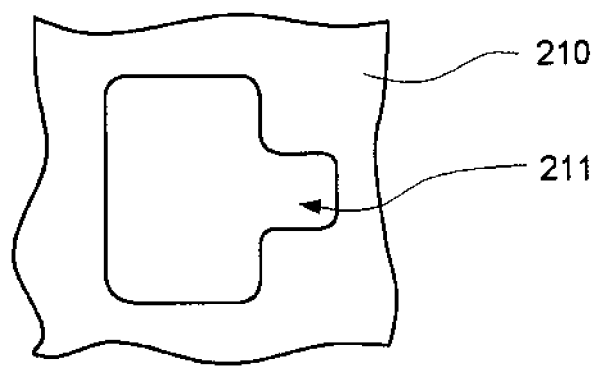
FIGS. 2(a) to 2(d) are diagrams useful for describing an example of a method for manufacturing a composite plug in brief.

Now, embodiments of the present invention will be described with reference to the drawings.

First Embodiment

In the following description, a "contact plug" refers to an "electrode (buried electrode) disposed in an electric insulating film to electrically connect one electronic circuit element to another electronic circuit element". A "heater electrode" refers to an "electrode which is in contact with a phase change layer and which generates Joule heat required to cause a phase change in the phase change layer". A "composite plug" refers to a "plug having at least two different types of plugs which are electrically connected together and which can be considered to be one plug as a whole".

According to the present invention, the "heater electrode" is formed in the same contact hole in which a contact plug is formed. A first plug of the composite plug functions as the heater electrode and can thus be called a "heater plug". However, the first plug has the characteristics of a contact plug.

FIG. 1 is a diagram useful for describing the characteristics structure of a phase change memory device in accordance with the present invention.

In FIG. 1, an NMOS transistor (N channel-insulating gate field effect transistor) M is a switching device for selecting a memory cell. The NMOS transistor M has a gate connected to a word line WL1.

The NMOS transistor (M) has a source connected to a ground potential (GND: reference potential) via a ground potential metal plug 100 consisting of a material β and a ground potential interconnection 102 that is a ground interconnection also consisting of the material β.

The NMOS transistor (M) has a drain electrically connected to a second plug 108 of a composite plug 104.

As shown in the figure, composite plug 104 is composed of a first plug 106 consisting of a first conductive material α and acting as a heater electrode (heater plug) and second plug 108 consisting of a second conductive material β and acting as a contact plug. The plugs 106 and 108 are in contact with each other at their sides. This ensures that the plugs 106 and 108 are electrically energized.

The first and second plugs need not necessarily be in direct contact with each other. For example, the plugs may be in surface contact with each other via an ITO (Indium Tin Oxide) film for blocking heat transfer.

The resistivity R11 of the first conductive material α and the resistivity R12 of the second conductive material β are in a relationship R11>R12. Here, the resistivity (ρ) is also called electric resistivity or volume resistivity. The reciprocal (1/ρ) of the resistivity is conductivity (also called electric conductivity or specific electric conductivity). The present invention adopts the terms "resistivity" and "conductivity". A metal material through which a current can flow easily transmits heat easily. Accordingly, a "material with a high resistivity" is a "material with a low electric conductivity and a low thermal conductivity". Therefore, for the conductive materials α and β in FIG. 1, a relationship α<β is met for conductivity and thermal conductivity.

In FIG. 1 the top surface of first plug 106 acting as a heater electrode is in contact with a part of a phase change layer (in this case, GST) 114. A phase changing region in which a phase change occurs is located in the vicinity of the interface between first plug 106 and phase change layer 114.

An upper electrode (electrode layer) 116 is formed on the top surface of phase change layer 114. An electrode terminal P is connected to upper electrode 116 so that various pulses such as those shown in FIG. 25(*b*) can be input to electrode terminal P. For the phase change memory IC, a bit line corresponds to electrode terminal P. This will be described later with reference to FIG. 6.

The phase change memory device configured as described above in accordance with the present embodiment enables the layer structure of each memory cell in the phase change memory device to be minimized to achieve a reduction in the size of the phase change memory device, simplification of the structure, and a reduction in manufacturing steps. This effect can be exerted by adopting composite plug 104.

Description will be given below of preferable aspects and characteristics of composite plug 104.

(1) Composite plug 104 is composed of first plug 106 and second plug 108. First conductive material α constituting first plug 106 and second conductive material β constituting second plug 108 have the relationship α>β for "resistivity" as described above. These conductive materials meet a relationship α<β for "electric conductivity" and "thermal conductivity".

If for example, titanium (Ti: electric conductivity: 2.34×$10^6$/mΩ, thermal conductivity: 21.9 W/m·K) is used as first conductive material α, tungsten, having higher electric and thermal conductivities (W: electric conductivity: 18.9×$10^6$/mΩ, thermal conductivity: 174 W/m·K), is used as second conductive material β.

In (2) and (3) below, available examples of the first and second conductive materials are listed. However, a metal material may appear both in (2) and in (3) (tungsten, molybdenum, and the like). That is, tungsten and molybdenum can be used either as the first conductive material or as the second conductive material. In the present invention is characterized by a combination of the materials rather than the materials themselves. Importantly, the relationship α>β is met for resistivity; the relationship α<β is met for electric and thermal conductivities.

(2) First plug 106 consists of first conductive material α, which is able to efficiently generate Joule heat when a current is passed through the material. Specifically, first conductive material α may comprise metal selected from titanium (Ti), tantalum (Ta), molybdenum (Mo), niobium (Nb), zirconium (Zr), and tungsten (W), or a nitride of this metal, or a silicide of this metal.

More specifically, first conductive material α may comprise any of titanium nitride (TiN), tantalum nitride (TaN), molybdenum nitride (MoN), niobium nitride, titanium-silicon nitride, titanium-aluminum nitride, titanium-boron nitride, zirconium-silicon nitride, tungsten-silicon nitride, tungsten-boron nitride, zirconium-aluminum nitride, molybdenum-silicon nitride, molybdenum-aluminum nitride, tantalum-silicon nitride, tantalum-aluminum-nitride, titanium oxynitride, titanium aluminum oxynitride, tungsten oxynitride, tantalum oxynitride, tantalum silicide (TaSi), tungsten silicide (WSi), or molybdenum silicide (MoSi).

(3) Second plug 108 consists of second conductive material β (for example, tungsten (W)) selected to enable a reduction in the resistance of the circuit. Second conductive material β is preferably the same as or similar to (or has the same main component as) the material of ground potential plug 100 requiring low resistivity and ground potential interconnect (ground interconnect) 102. Specifically, second conductive material β may be metal selected from tungsten (W), aluminum (Al), molybdenum (Mo), and copper (Cu), or a silicide of this metal.

(4) The numerical orders of electric and thermal conductivities of the metals that can be used as the main components of the first and second conductive materials (α and β) are generally as follows; these values are not restrictive but are only illustrative for the preferred embodiment.

Desirably, the metal material (first conductive material α) constituting the main component of first plug 106 has, for example, an electric conductivity of order of $1.0 \times 10^6$/mΩ and a thermal conductivity of order of 10.0 W/m·K. The metal material (second conductive material β) constituting the main component of second plug 108 has, for example, an electric conductivity of order of $10.0 \times 10^6$/mΩ and a thermal conductivity of order of 100.0 W/m·K. There is a difference of about 10 times, preferably at least 10 times, in both conductivity and thermal conductivity between the conductive materials α and β.

The conductivity and thermal conductivity of metal materials that are candidates for the main components of the first and second conductive materials α and β are as follows. In the following, electric conductivity is denoted by C and thermal conductivity is denotes by P.

(Candidates for the Main Component of the First Conductive Material α)

Ti (titanium): $C=2.34 \times 10^6$/mΩ, $P=21.9$ W/m·K

Nb (niobium): $C=6.93 \times 10^6$/mΩ, $P=53.7$ W/m·K

Ta (tantalum): $C=7.61 \times 10^6$/mΩ, $P=57.5$ W/m·K

Zr (zirconium): $C=2.36 \times 10^6$/mΩ, $P=22.7$ W/m·K

TiN (titanium nitride): since a nitride of a metal takes over the nature of that metal, TiN is expected to offer characteristics similar to those of Ti (titanium).

(Candidates for the Main Component of the Second Conductive Material β)

Al (aluminum): $C=37.7 \times 10^6$/mΩ, $P=237$ W/m·K

Mo (molybdenum): $C=18.7 \times 10^6$/mΩ, $P=138$ W/m·K

Cu (copper): $C=59.6 \times 10^6$/mΩ, $P=401$ W/m·K

W (tungsten): $C=18.9 \times 10^6$/mΩ, $P=174$ W/m·K

The numerical values of electric conductivity (and the resistivity of the thin film) and thermal conductivity of each metal material indicate as follows. The metal material that can be used as the main component of the first conductive material α has a conductivity of order of $1.0 \times 10^6$/mΩ and a thermal conductivity of order of 10.0 W/m·K. The metal that can be used as the main component of the second conductive material β has a conductivity of order of $10.0 \times 10^6$/mΩ and a thermal conductivity of order of 100.0 W/m·K. Further, there is a difference of about 10 times in both conductivity and thermal conductivity between the conductive materials α and β.

(5) Example of the preferred conductive material include titanium nitride (TiN) and tungsten (W). That is, a thin film of titanium nitride (TiN) can be used as the first conductive material (α). A thin film of tungsten (W) can be used as the second conductive material (β). A thin film of titanium nitride (TiN) will be compared with a thin film of tungsten (W) for resistivity.

If a thin film of metal nitride is formed by the CVD method, resistivity varies depending on a raw material gas. The width of a variation in resistivity value also varies depending on the raw material gas. The inventors' experiments show that the resistivity of a TiN thin film can be varied from 220 μΩ·cm to 900 μΩ·cm if $TiCl_4$ is used as a raw material gas. The experiments also show that with the MOCVD method (raw material gas: $Ti[N(C_2H_5)_2]_4$), the resistivity of the TiN thin film can be varied from 220 μΩ·cm to 6,000 μΩ·cm. In either case, the experiments show that the TiN thin film offers a considerably high resistivity.

The inventors produced a thin film of W (tungsten) by the CVD method. The thin film was determined to offer a resistivity of 10 μΩ·cm, which is at most 1/10 of resistivity of titanium nitride (TiN).

(6) Second plug 108 in FIG. 1 desirably has a larger volume than first plug 106 in FIG. 1. That is, first plug 106, acting as a heater electrode, has its electric resistance unavoidably increased during operation. However, provided that second plug 108, consisting of the highly conductive material, has a larger volume than the first plug 106, the total electric resistance of the composite plug 104 is dominantly determined by second plug 108. This makes it possible to reduce the resistance of composite plug 104 as a whole. This is advantageous for circuit operations.

(7) Composite plug 104 in FIG. 1 has a planar shape consisting of a main body portion X1, a portion of composite plug 104 mainly occupied by second plug 108, and a protruding portion X2 which protrudes from the main body portion, a portion of composite plug 104 mainly occupied by first plug 106. The planar shape with main body portion X1 and protruding portion X2 is based on considerations for the manufacture of the composite plug. Specifically, a contact hole is formed in the interlayer insulating film so as to have a planar shape with a wide main body and a narrow protruding portion. A thin film of the first conductive material is then formed by the CVD method. In this case, the narrow protruding portion X2 is completely filled with the first conductive material but not the wide main body portion X1, in which large recesses remain. Thus, the recesses are completely filled with the second conductive material to enable the composite plug 104 to be easily formed. This will be described below in detail with reference to FIGS. 2 to 5.

Second Embodiment

In the present embodiment, a method for manufacturing a composite plug will be described in brief.

The composite plug 104, shown in FIG. 1, can be easily formed by a general technique for filling the contact hole.

Specifically, a narrow groove and a wide groove are formed in the interlayer insulating film and filled with the first conductive material to a predetermined film thickness. In this case, the narrow groove can be completely filled with the first conductive material but not the wide groove, in which a recess remains. Thus, the recess is further filled with the second conductive material to enable a composite plug to be easily formed by a general-purpose technique.

FIGS. 2(a) to 2(d) are diagrams useful for describing, in brief, an example of a method for manufacturing a composite plug.

As shown in FIG. 2(a), a first contact hole 211 is formed on a first interlayer insulating film 210. The first contact hole has a planar shape having a wide main body portion and a narrow protruding portion like a letter T (or an inverted letter T (⊥)).

Figure 2B:
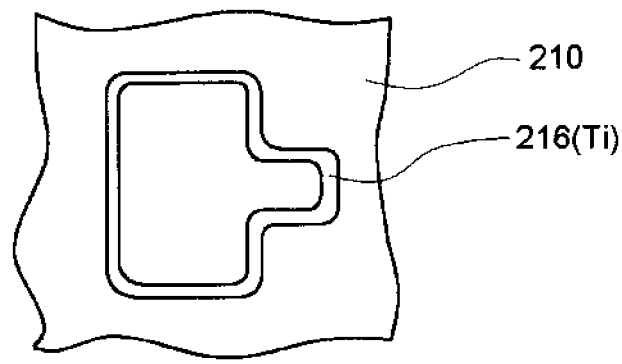

Then, as shown in FIG. 2(b), a thin titanium (Ti) film 216 is formed as a barrier metal. Titanium (Ti) film 216 serves to prevent the abnormal reaction between a metal material filled into the contact hole 211 and an underlying silicon substrate.

Figure 2C:
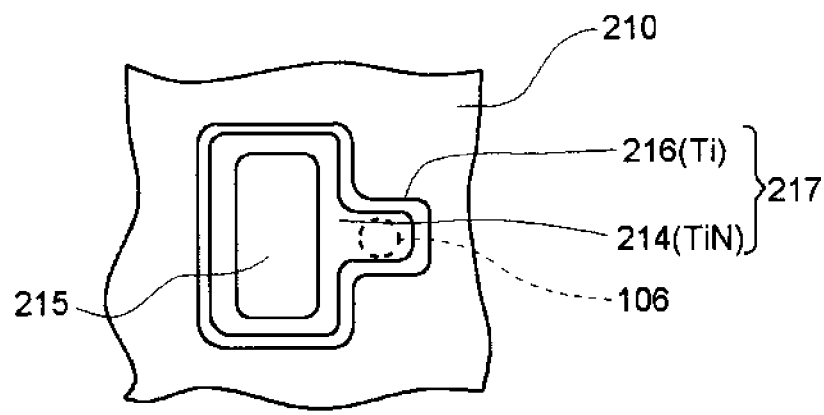

Then, as shown in FIG. 2(c), titanium nitride (TiN) 214 as a first conductive material is buried in the contact hole 211. At this time, contact hole 211 is not completely filled with titanium nitride 214, with a recess 215 remaining in contact hole 211. In FIG. 2(c), for convenience of the subsequent description, reference symbol 217 denotes a metal film comprising of titanium (Ti) film 216 and titanium nitride (TiN) film 214.

Figure 2D:
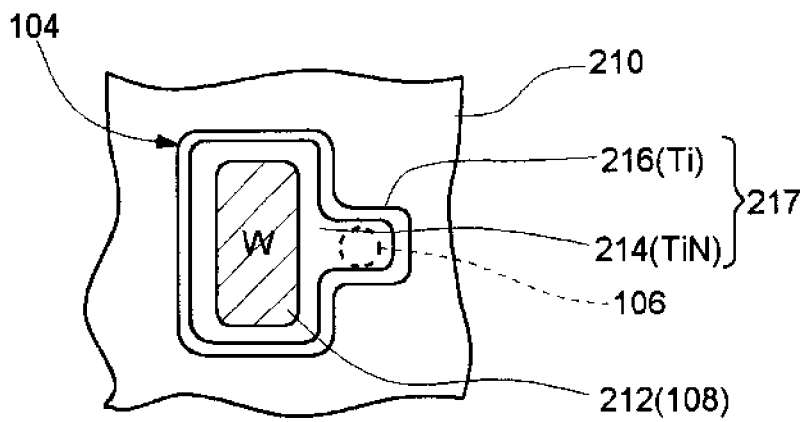

Then, as shown in FIG. 2(d), tungsten (W) as a second conductive material is buried in the recess 215 to form tungsten (W) film 212. Tungsten (W) film 212 corresponds to second plug 108 in FIG. 1. A portion of titanium nitride (TiN) film 214 enclosed by a dotted line in the figure corresponds to first plug 106, acting as a heater electrode.

Thus adjusting the planar shape of the first contact hole and the thicknesses of the thin films of the first and second conductive materials enables the composite plug to be easily formed simply by using the technique for filling the first contact hole (CVD or the like). This means that phase change memories using composite plugs can be mass-produced.

Third Embodiment

In the present embodiment, with reference to FIGS. 3 to 5, description will be given of an example of the sectional structure of an IC comprising a switching device, a ground potential plug, and a composite plug, an example of a process of manufacturing the IC, and an example of planar shape of the composite plug.

Figure 3:
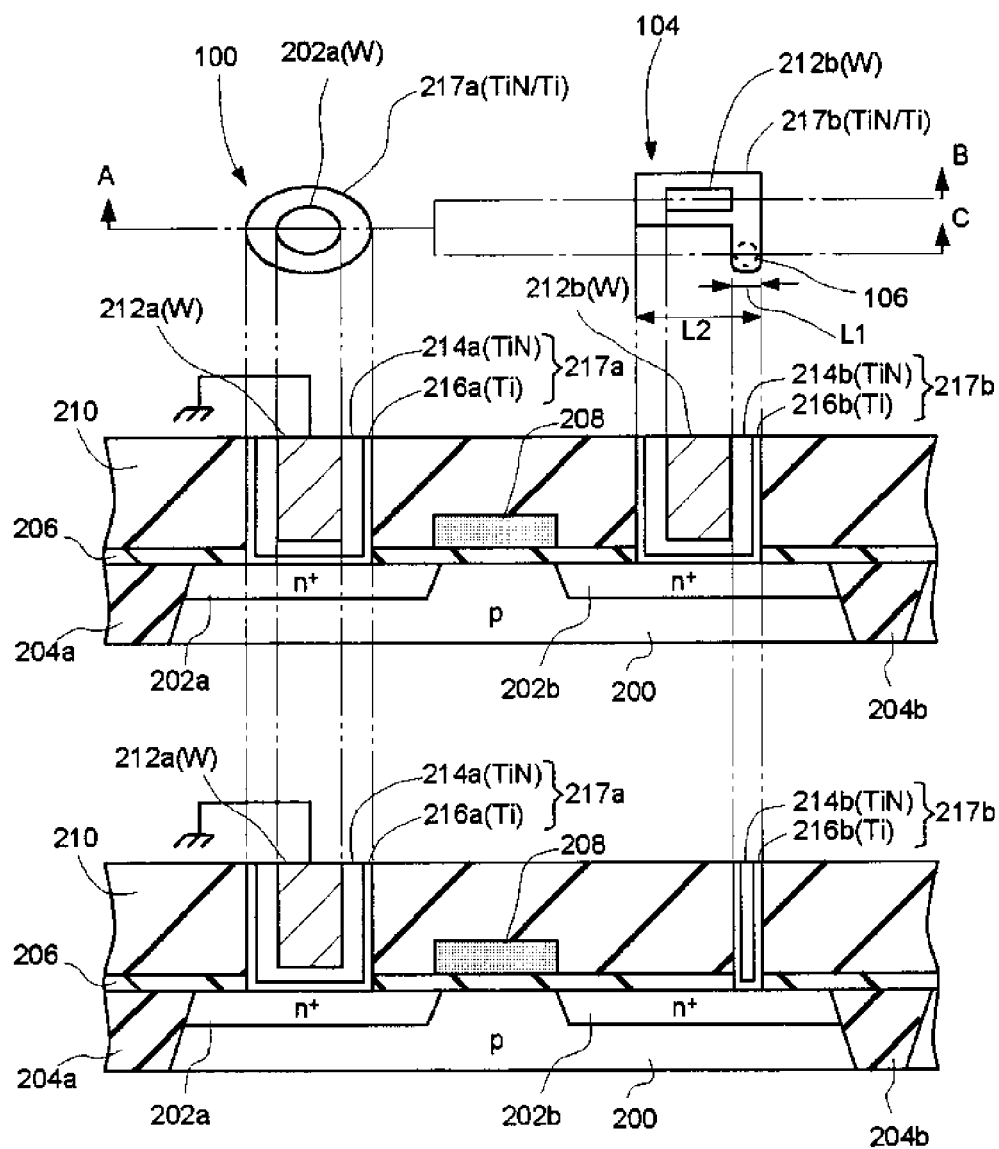
FIG. 3 is a diagram showing an example of sectional structure of an IC comprising a switching device, a ground potential plug, and a composite plug.

FIG. 3 is a diagram showing an example of the sectional structure of an IC comprising a switching device, a ground potential plug and a composite plug.

The upper part of FIG. 3 shows the planar shape of the composite plug and ground potential plug. The center of FIG. 3 shows a cross-section of the device taken along line A-B in the upper part of the figure. The lower part of FIG. 3 shows a cross-section of the device taken along line A-C in the upper part of the figure.

Ground potential plug 100 and composite plug 104 consist of TiN/Ti films 217a and 217b and tungsten (W) films 212a and 212b, respectively; the TiN/Ti film consists of an underlying Ti film and a titanium nitride film disposed on the Ti film. Here, titanium nitride (TiN) films 214a and 214b correspond to the first conductive material α in FIG. 1. Tungsten (W) films 212a and 212b correspond to the second conductive material β.

In the upper figure, the (TiN/Ti) films are considered to be unitary films and denoted by reference symbols 217a and 217b. However, in the central and lower figures, the titanium films (Ti) are denoted by reference symbols 216a and 216b, and the TiN films are denoted by reference symbols 214a and 214b. Thin titanium (Ti) films 216a and 216b are barrier metal films that ensure the appropriate contact between the TiN films and the underlying silicon substrate 200. Titanium (Ti) films 216a and 216b are thus not essential, and titanium nitride (TiN) films 214a and 214b function as the first conductive material.

As is apparent from the upper figure, ground potential plug 100 is circular (elliptical). The periphery of a contact hole in first interlayer insulating film 210 is filled with TiN/Ti film 217a. The center of the contact hole is filled with W (tungsten) 212a.

As described with reference to FIG. 1, composite plug 104 is shaped like a combination of a main body portion and a protruding portion (shape like the letter L). Variations of planar shape of composite plug 104 will be described below with reference to FIG. 5.

A narrow portion including the protruding portion is filled with TiN/Ti film 217b. The center of the wide main body portion is filled with W (tungsten) 212b. The width of the protruding portion is denoted by L1. The width of the main body is denoted by L2. The vicinity of tip of the protruding portion functions as first plug 106, constituting a heater electrode.

As is apparent from the center of FIG. 3, an NMOS transistor is formed in a field area of p-type semiconductor substrate 200 which is enclosed by STIs (Shallow Trench Isolations) 204a and 204b. The NMOS transistor is composed of n-type diffusion layers (source layer and drain layer) 202a and 202b, a gate insulating film 206, and a gate electrode (doped polysilicon layer) 208. Contact holes are formed in first interlayer insulating film 210 and sequentially filled with Ti, TiN, and W. Ground potential plug 100 and composite plug 104 are thus constructed.

As is apparent from the lower figure, the protruding portion of composite plug 104 is completely filled with titanium (Ti) film 216a and titanium nitride (TiN) film 214b.

Now, description will be given of a method for manufacturing the structure of an essential part of the phase change memory device shown in FIG. 3. FIGS. 4(a) to 4(d) are cross-sectional views of respective steps of the method for manufacturing the structure of the essential part of the phase change memory device shown in FIG. 3.

Figure 4A:
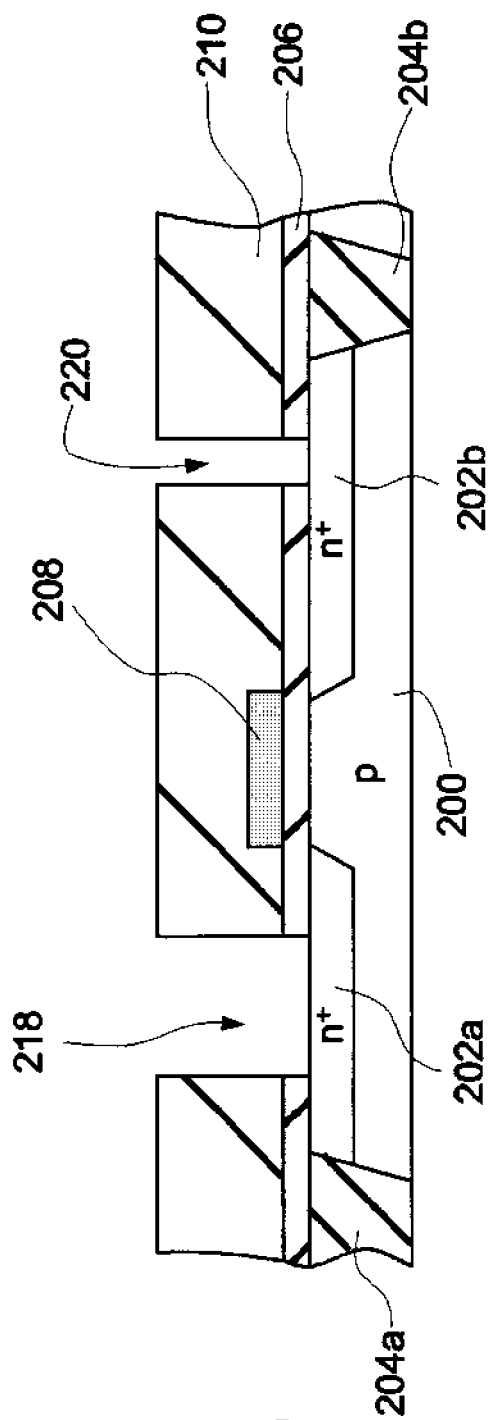

As shown in FIG. 4(a), first, STIs (Shallow Trench Isolations) 204a and 204b are formed in p-type semiconductor substrate 200. The region surrounded by the STIs (field region) constitutes an active region in which elemental devices are formed. A gate insulating film 206 is formed on a surface of semiconductor substrate 200 to a thickness of, for example, 7 nm. Subsequently, for example, doped polysilicon (thickness: 100 nm) and tungsten silicide (thickness: 100 nm) are sequentially deposited. A mask for photolithography is further formed and the doped polysilicon and tungsten silicide are anisotropically etched to form a gate electrode 208. Phosphorous (P) is subsequently ion-implanted through gate electrode 208 as a mask and thermally treated to form n-type diffusion layers (source layer and drain layer) 202a and 202b. A first interlayer insulating film 210 (thickness: 700 nm) consisting of a TEOS oxide film is subsequently formed and flattened by CMP (Chemical Mechanical Polishing). First interlayer insulating film 210 is then patterned to form a contact hole (opening; for example, 200 nm in width) 218 which has a circular planar shape and in which a ground potential plug 100 is to be formed, and a contact hole 220 which has an planar shape like the letter L (see the upper right of FIG. 3) and in which a composite plug 104 is to be formed.

Exactly speaking, reference symbol 220 in FIG. 4 denotes the narrow groove corresponding to the protruding portion of the first contact hole and will be used in the description below. Groove 220 is, for example, 100 nm in width.

Figure 4B:
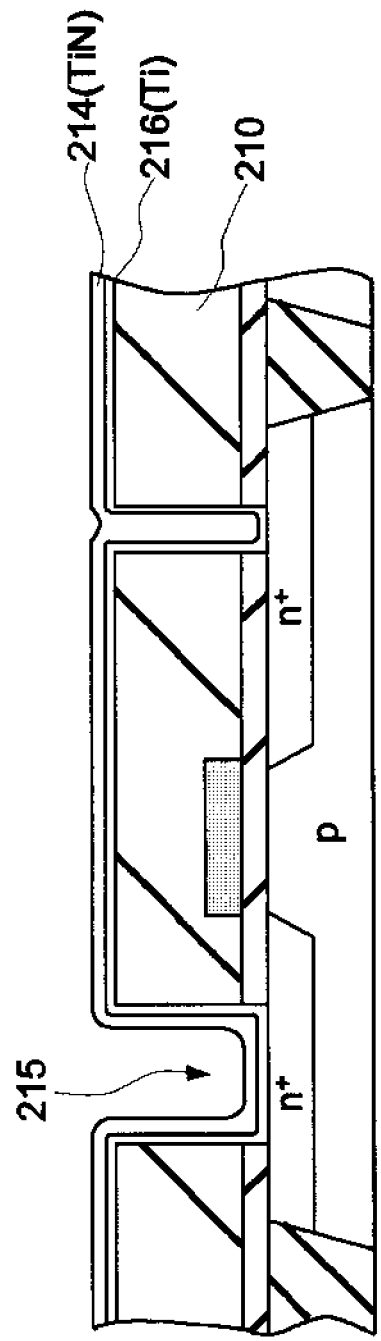

Then, as shown in FIG. 4(b), titanium (Ti) film 216 of thickness 15 nm and titanium nitride (TiN) film 214 of thickness 50 nm are stacked. At this time, the narrow groove 220 is completely filled with the TiN/Ti film. On the other hand, the wide contact hole 218 is covered with the TiN/Ti film only at its bottom surface and sides. Although not shown, this applies to the wide main body portion of composite plug 104.

Then, as shown in FIG. 4(c), tungsten (W) 212 is deposited to a thickness of about 250 nm. Subsequently, as shown in FIG. 4(d), tungsten (W) film 212 and TiN/Ti films (214 and 216) are consecutively flattened by CMP. This forms a ground potential plug 100 and a composite plug 104.

In FIG. 4(d), reference symbols 214a and 216a are collectively shown as reference symbol 217a, and reference symbols 214b and 216b are collectively shown as reference symbol 217b. The tungsten (W) layer in ground plug 100 is denoted by reference symbol 212a. The tungsten (W) layer in composite plug 104 is denoted by reference symbol 212b. These reference symbols are also used in the drawings described below.

Now, an example of planar shape of the composite plug will be described.

Figure 5A:
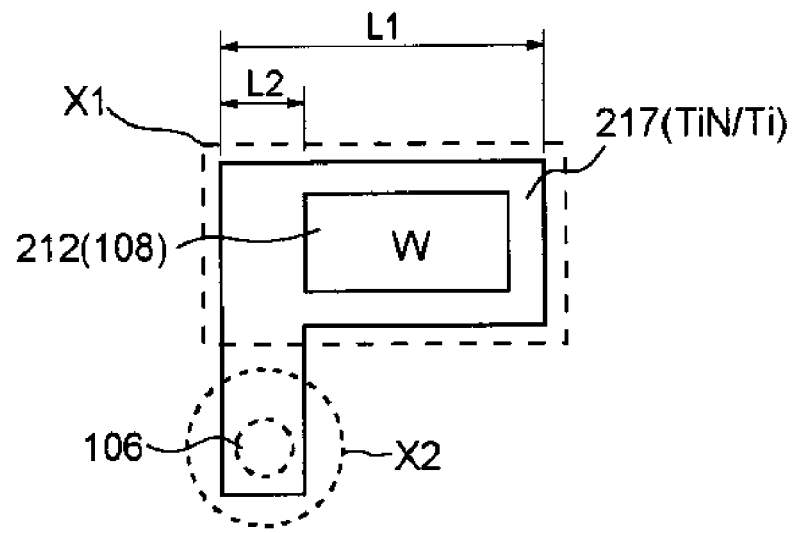
FIGS. 5(a) to 5(d) are diagrams useful for describing examples (variations) of planar shape of the composite plug.
Figure 5B:
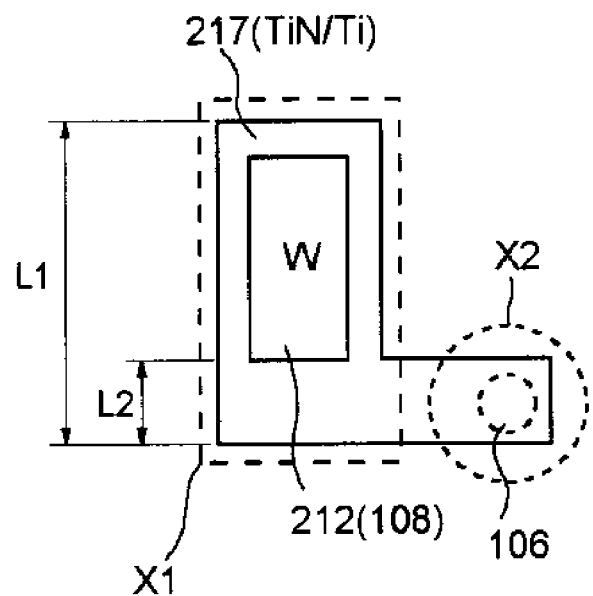
Figure 5C:
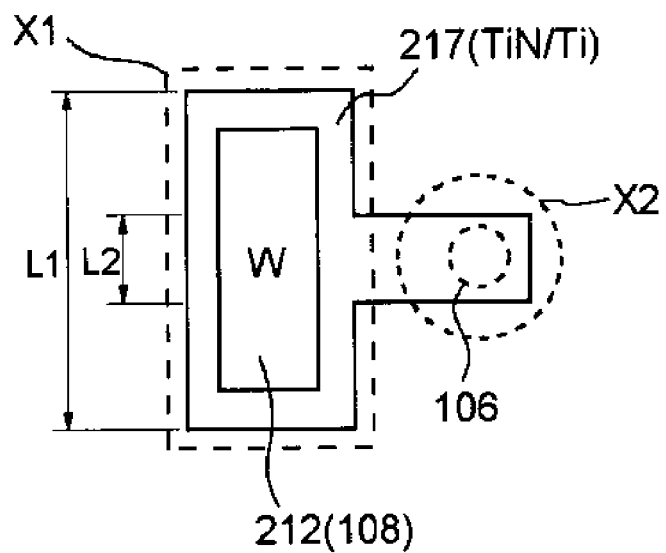
Figure 5D:
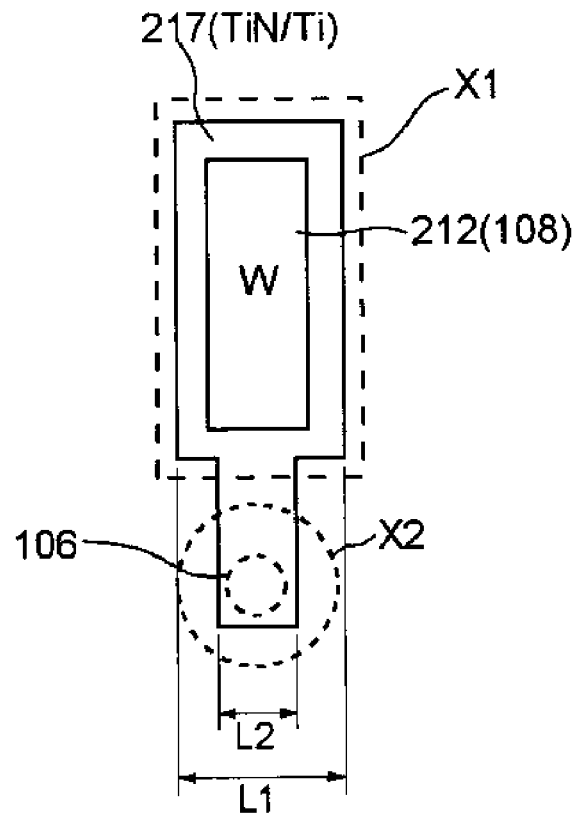

FIGS. 5(a) to 5(d) are diagrams useful for describing examples (variations) of planar shape of the composite plug. FIG. 5(a) shows a P-shaped type, FIG. 5(b) shows an L-shaped type, FIG. 5(c) shows a first projection type (T-shaped type), and FIG. 5(d) shows a second projection type (I-shaped type).

As shown in the figures, each of the composite plugs in FIGS. 5(a) to 5(d) is composed of main body portion X1 and protruding portion X2. The width of main body portion X1 is denoted by L1. The width of protruding portion X2 is denoted by L2. Width L2 is sufficiently smaller than width L1.

The part of reference symbole 212 which filled with tungsten (W) corresponds to second plug 108 in FIG. 1. Th part filled with TiN/Ti film 217 that is surrounded by a dotted circle in protruding portion X2 of the figure corresponds to first plug 106, acting as a heater electrode in FIG. 1.

Fourth Embodiment

In the present embodiment, description will be given of the circuit configuration of the phase change memory device (phase change memory IC), the layout of a memory cell, the specific sectional structure of the memory cell, and a specific method for manufacturing the memory cell.

Figure 6:
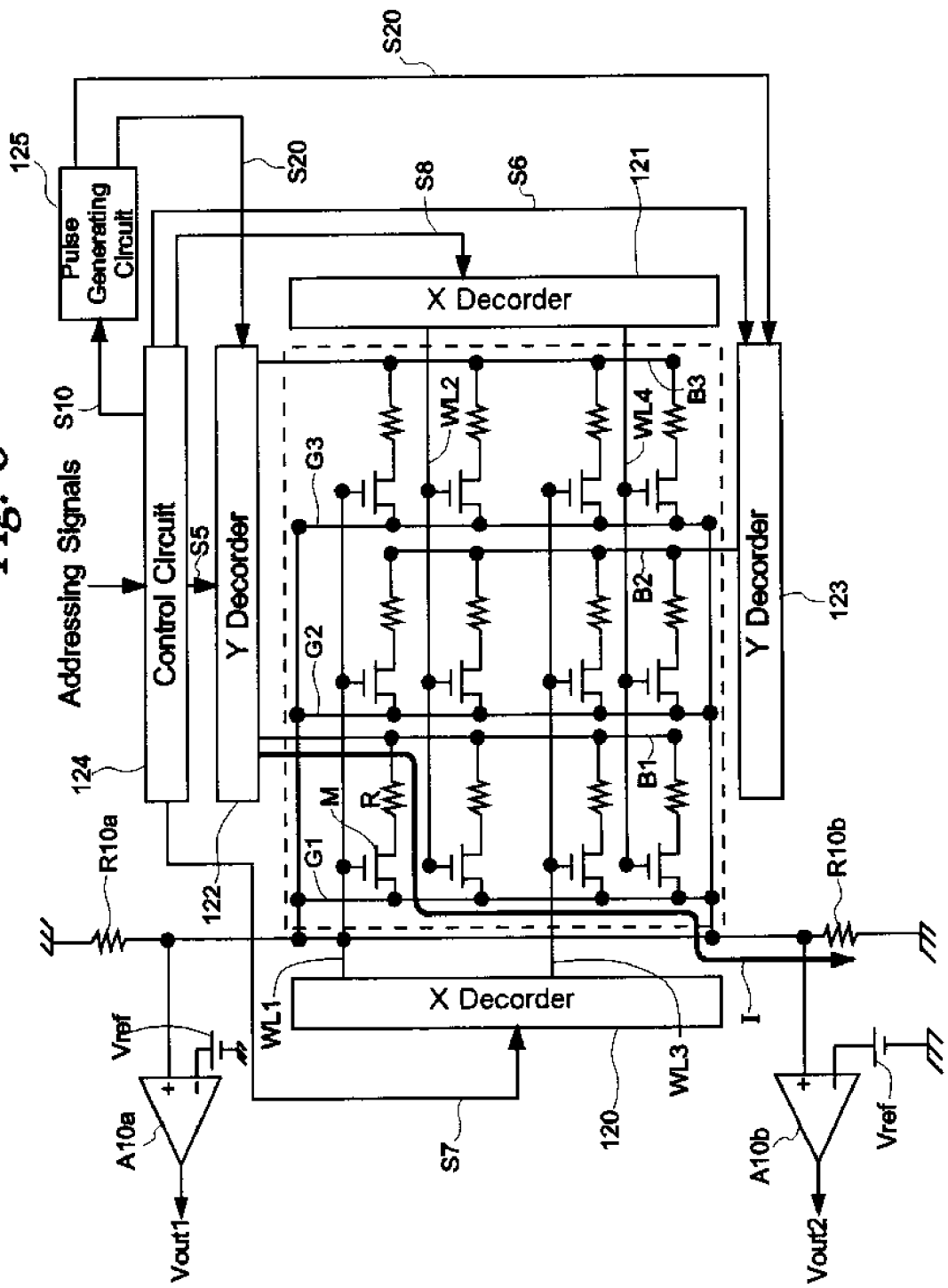
FIG. 6 is a circuit diagram showing an example of circuit configuration of the entire phase change memory device (phase change memory IC) in accordance with the present invention.

FIG. 6 is a circuit diagram showing an example of circuit configuration of the entire phase change memory device (phase change memory IC) in accordance with the present invention.

As shown in the figure, a memory cell portion having memory cells arranged in a matrix is placed in the center of the phase change memory IC; each of the memory cells is composed of a MOS transistor (M) for device selection and the phase change memory device in accordance with the present invention, which is shown as an equivalent resistor R in the figure.

In the figure, reference symbols G1 to G3 denote ground lines, reference symbols WL1 to WL4 denote word lines, and reference symbols B1 to B3 denote bit lines.

X decoders 120 and 121 and Y decoders 122 and 123 constitute an address circuit. X decoders 120 and 121 drive word lines WL1 to WL4 and Y decoders 122 and 123 drive bit lines B1 to B3.

A control circuit 124 integrally controls the operation of the phase change memory IC. Control circuit 124 supplies Y decoders 122 and 123 and X decoders 120 and 121 with control signals S5 to S8 to individually control the operations of decoders 120 to 123.

A pulse generating circuit 125 generates and supplies various pulse signals (set pulse, reset pulse, and read pulse) S20 to Y decoders 122 and 123 in accordance with a control signal S10 from control circuit 124.

In FIG. 6, reference symbols A10a and A10b denote operational amplifiers that constitute a sense circuit. Reference symbols R10a and R10b denote current/voltage converting resistors for converting current I (shown by a thick solid line in the figure) into a voltage. Reference symbol $V_{ref}$ denotes a reference voltage, and reference symbols $V_{out1}$ and $V_{out2}$ denote detection signals (read signals) from the phase change memory IC.

Figure 7:
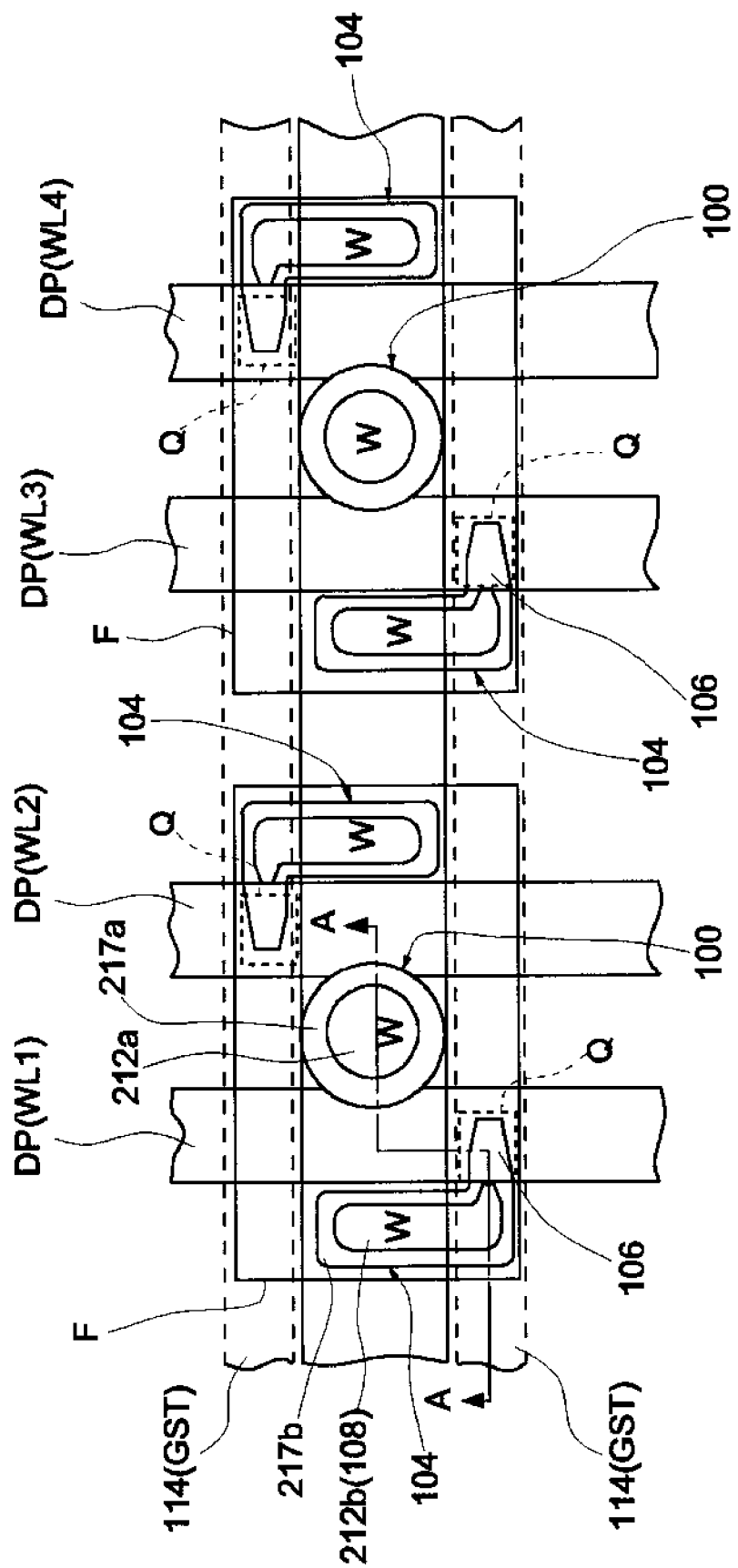
FIG. 7 is a plan view showing an example of layout of elements and interconnections in a memory cell area of the phase change memory device (phase change memory IC) shown in FIG. 6.

FIG. 7 is a plan view showing an example of layout of elements and interconnections in the memory cell area of the phase change memory device (phase change memory IC) shown in FIG. 6. In FIG. 7, the same components as those in FIG. 6 are denoted by the same reference symbols.

In FIG. 7, reference symbol 100 denotes a ground potential plug composed of TiN/Ti layer 217a and tungsten (W) layer 212a.

Reference symbol 104 denotes a composite plug composed of TiN/Ti layer 217b and tungsten (W) layer 212b. A part of the titanium nitride (TiN) layer functions as first plug 106 in FIG. 1. Tungsten (W) layer 212b constitutes second plug 108 in FIG. 1. Composite plug 104 has a planar shape like the letter L (see FIG. 5(b)).

In FIG. 7, an area F surrounded by a thick solid line is an active region. Four interconnections (DP) laid in the memory cell area in a vertical direction are doped polysilicon layers constituting word lines (WL1 to WL4); these interconnections also serve as gate electrodes of MOS transistors.

In FIG. 7, a GST film 114 as a phase change layer is laid in a horizontal direction. Reference symbol Q denotes the connection area between first plug 106 (see FIG. 1), acting as a heater electrode, and GST film 114; the connection area is formed by removing a second insulating film.

Figure 8:
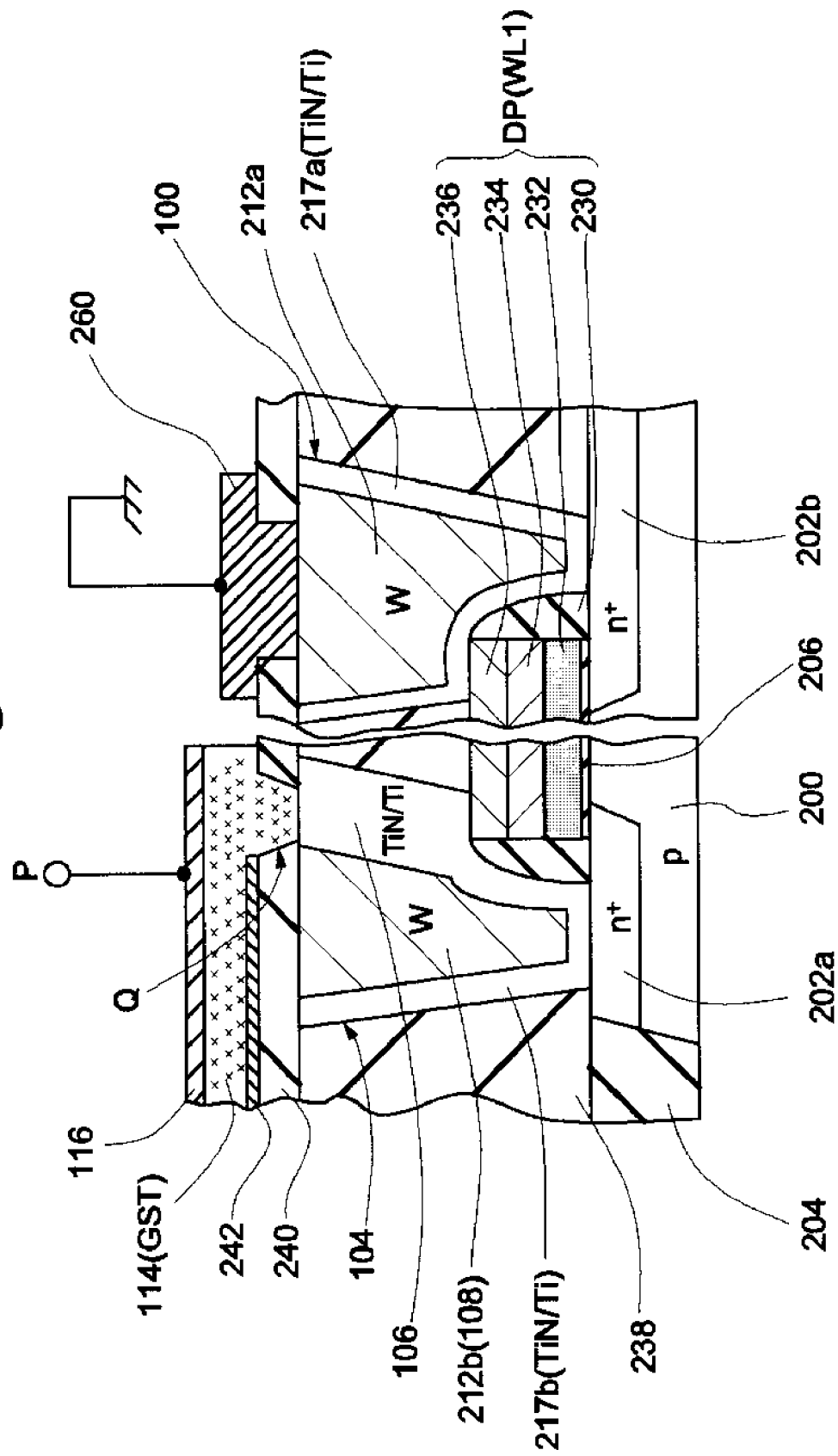
FIG. 8 is a cross-sectional view of the device taken along line A-A in FIG. 7.

FIG. 8 is a cross-sectional view of a device taken along line A-A in FIG. 7. In FIG. 8, the same components as those in FIGS. 3 and 4 are denoted by the same reference symbols.

The device structure in FIG. 8 is basically the same as the structure of the composite plug and ground potential plug shown in FIGS. 3 and 4 except for the cut surface.

That is, composite plug 104 is composed of tungsten (W) layer 212b and the TiN/Ti layer 217b. The protruding portion composed of TiN as the first conductive material α as described with reference to FIG. 1 acts as first plug 106, corresponding to the heater electrode.

A second insulating film (oxide film) 240 is disposed on composite plug 104 and patterned to expose the top surface of the first plug 106, acting as a heater electrode. GST film 114 as a phase change layer is in contact with the exposed first plug 106. In the figure, reference character Q denotes an opening in second insulating film (oxide film) 240. Reference symbol 242 denotes an adhesion layer (Ti layer) for improving the adhesion between second insulating film 240 and GST film 114. Reference symbol 116 denotes the upper electrode on GST film 114.

Ground potential plug 100 is similarly composed of tungsten (W) layer 212a and TiN/Ti layer 217a.

In FIG. 8, the gate electrode of the NMOS transistor is composed of a laminate of doped polysilicon layer 232 (thickness: 100 nm), tungsten silicide layer 234 (thickness: 100 nm), and nitride film 236 (thickness: 100 nm). The gate electrode further has side walls 230 consisting of a silicon nitride film ($Si_3N_4$).

Sides and top surfaces of layers 232 and 234, constituting the gate electrode, are covered with insulating films (230 and 236) in order to prevent a possible short circuit between layers 232 and 234 and the nearby composite plug 104 (or ground potential plug 100).

In FIG. 8, reference symbol 238 denotes a first interlayer insulating film consisting of a TEOS oxide film. Reference symbol 260 denotes a ground electrode (ground interconnection) consisting of tungsten (W).

Fifth Embodiment

Figure 9:
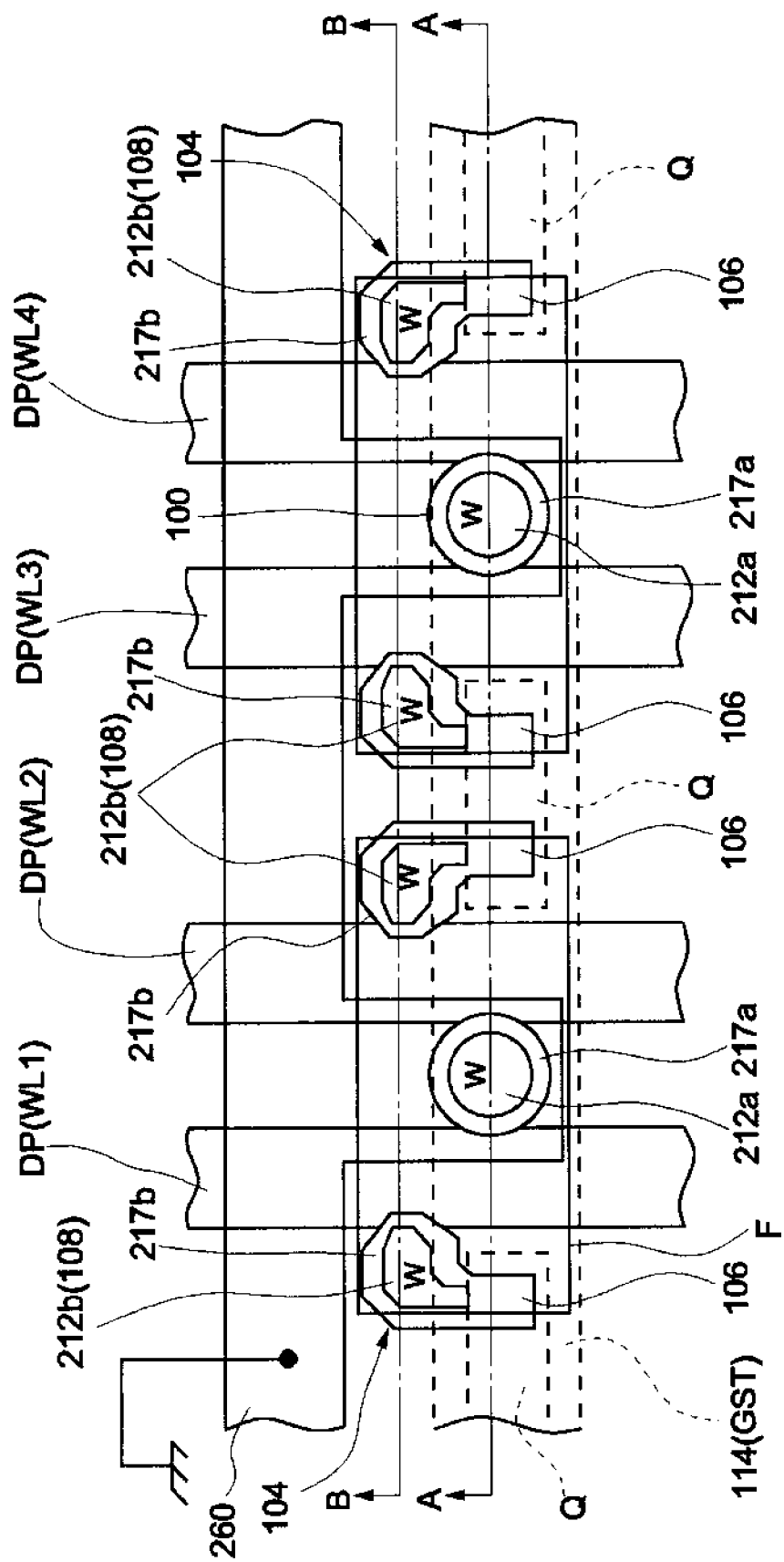
FIG. 9 is a plan view showing another example of layout of elements and interconnections in the memory cell area of the phase change memory device (phase change memory IC) shown in FIG. 6.

FIG. 9 is a plan view showing another example of layout of elements and interconnections in the memory cell area of the phase change memory device (phase change memory IC) shown in FIG. 6. In FIG. 9, the same components as those in FIG. 7 are denoted by the same reference symbols.

In FIG. 9, reference symbol 100 denotes a ground potential plug. Reference symbol 104 denotes a composite plug. Composite plug 104 has a planar shape like the letter P (see FIG. 5(a)).

In FIG. 9, the area F is an active region. The four interconnections (DP) laid in the memory cell area in the vertical direction are doped silicon layers constituting the word lines (WL1 to WL4); these interconnections also serve as gate electrodes of the MOS transistor.

In FIG. 9, GST film 114 as a phase change layer is provided. Reference symbol Q denotes the connection area between first plug 106, acting as a heater electrode, and GST film 114; the connection area is an opening formed by removing a second insulating film. Connection area Q strides over two adjacent first plugs 106. This provides a larger alignment margin. This will be described below in detail.

In FIG. 9, reference symbol 260 denotes a ground potential interconnection that is a ground interconnection made of tungsten (W) for grounding ground potential plug 100 (corresponding to ground lines G1 to G3 in the circuit in FIG. 6).

With reference to FIGS. 10 to 15, description will be given of a process of manufacturing the sectional structure of the device shown along line A-A in FIG. 9. FIGS. 10 to 15 are cross-sectional views of the device taken along line A-A in FIG. 9, the views showing a method for manufacturing the sectional structure of the device. FIG. 16 is a cross-sectional view of the device taken along line B-B in FIG. 9.

Figure 10:
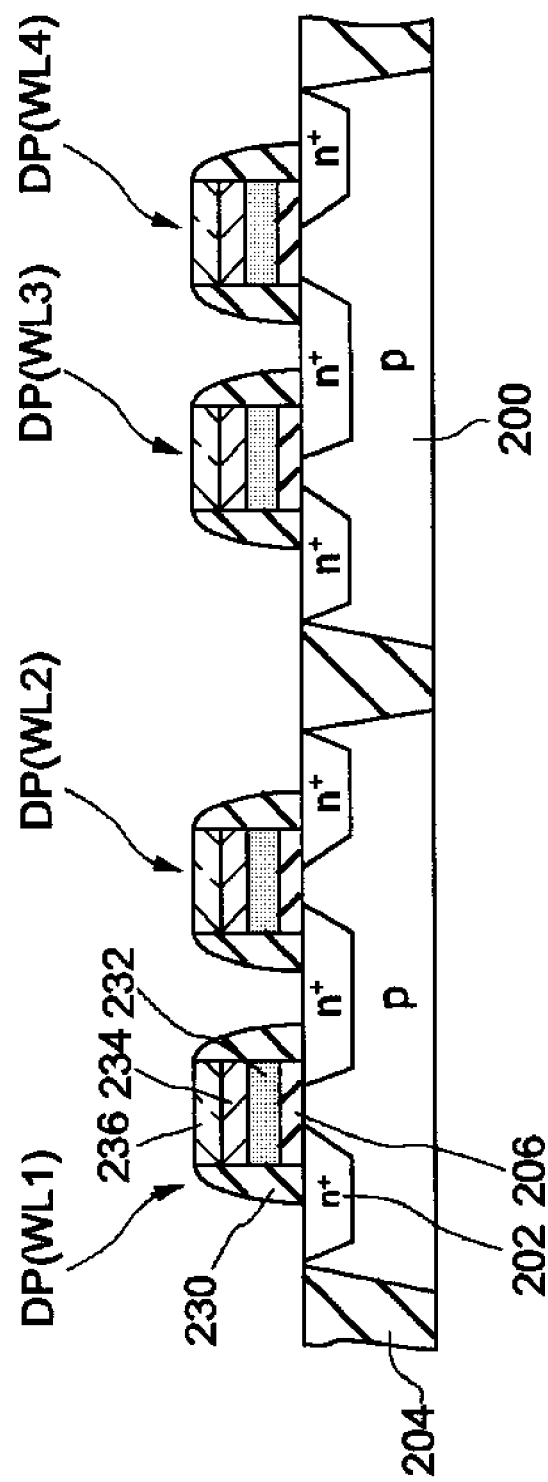
FIG. 10 is a cross-sectional view useful for describing a method for manufacturing the sectional structure of the device along line A-A in FIG. 9, the view showing a first manufacturing step.

(1) Step 1 (FIG. 10)

First, as shown in FIG. 10, STIs (Shallow Trench Isolations) 204 are formed in p-type semiconductor substrate 200. An area surrounded by the STIs (field regions) is an active region. A gate insulating film 206 is then formed on the surface of semiconductor substrate 200 to a thickness of, for example, 7 nm. Subsequently, for example, doped silicon 232 (thickness: 100 nm), tungsten silicide 234 (thickness, 100 nm), and nitride film 236 are sequentially deposited. A mask for photolithography is further formed and nitride film 236, tungsten silicide 234, and doped polysilicon 232 are consecutively anisotropically etched.

A silicon nitride film is subsequently formed all over the surface of the semiconductor substrate. Side walls 230 are formed by anisotropic etching such as RIE (Reactive Ion Etching). The thus formed gates of MOS transistors constitute the word lines DP (WL1 to WL4) in the circuit in FIG. 6.

Figure 11:
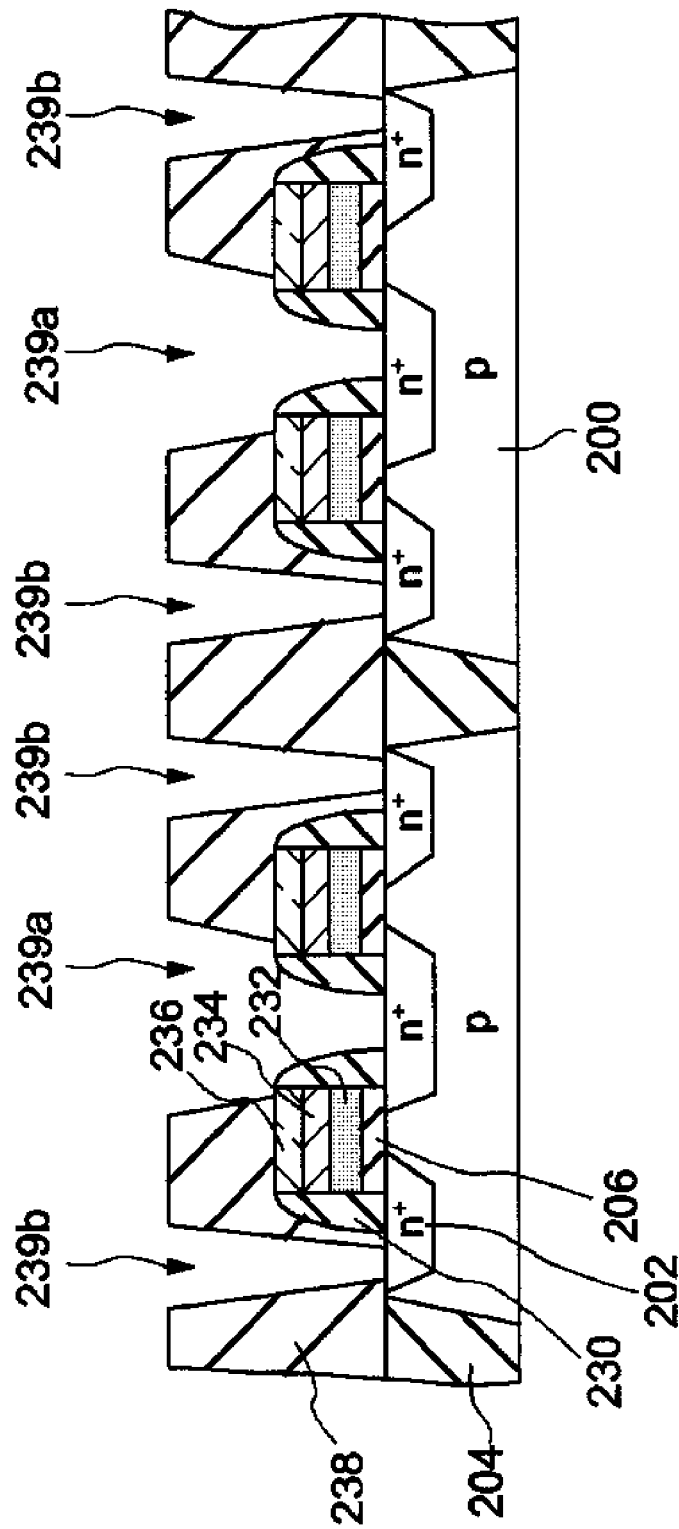
FIG. 11 is a cross-sectional view useful for describing the method for manufacturing the sectional structure of the device along line A-A in FIG. 9, the view showing a second manufacturing step.

(2) Step 2 (FIG. 11)

As shown in FIG. 11, first interlayer insulating film 238 (thickness: 700 nm) consisting of a TEOS oxide film is formed and flattened by CMP (Chemical Mechanical Polishing). First interlayer insulating film 238 is then patterned to form a contact hole (opening; for example, 200 nm in diameter) 239a which has a circular planar shape and in which a ground potential plug 100 is to be formed, and a contact hole (opening) 239b which has an planar shape like the letter P (see FIGS. 8 and 5(a)) and in which a composite plug 104 is to be formed; reference symbol 239b shows the narrow groove corresponding to the protruding portion and will be called groove 239b in the description below. Groove 239b is, for example, 100 nm in width.

Figure 12:
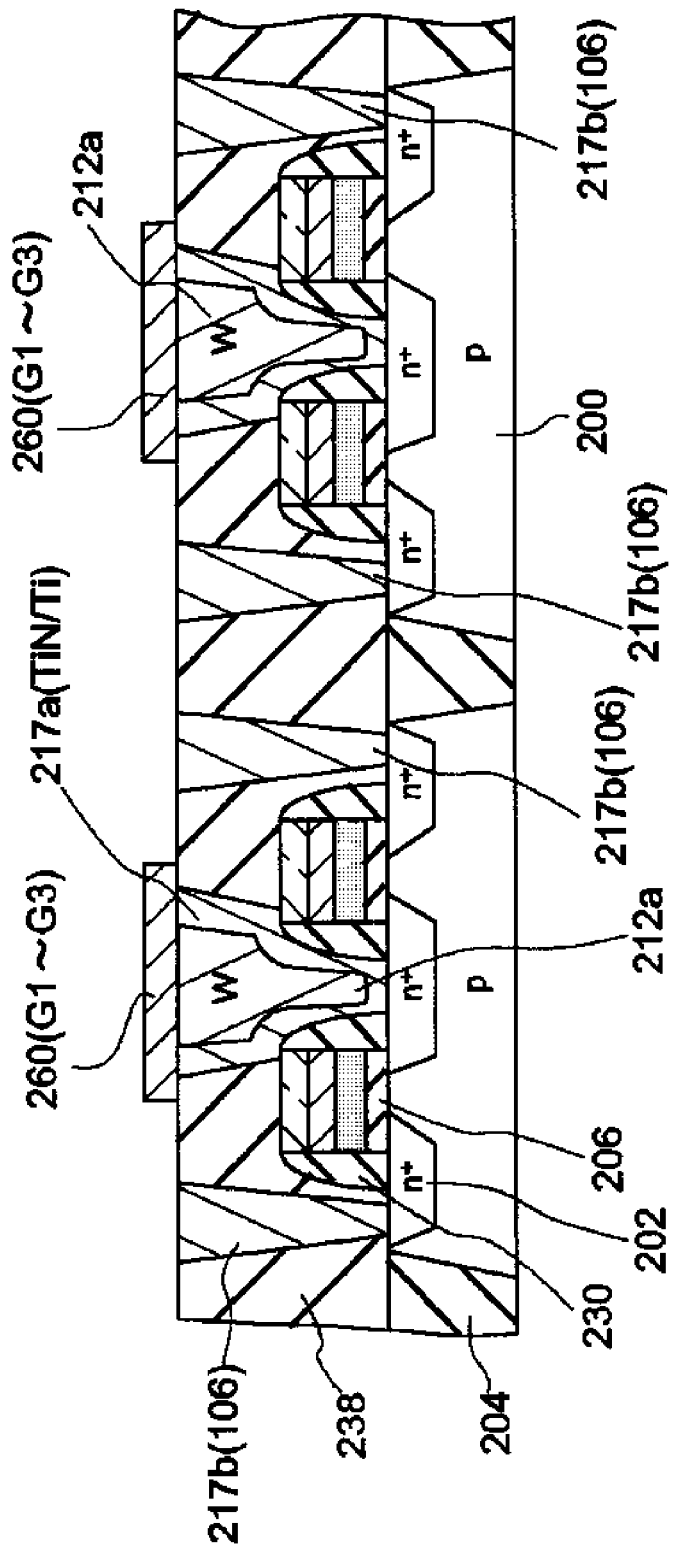
FIG. 12 is a cross-sectional view useful for describing the method for manufacturing the sectional structure of the device along line A-A in FIG. 9, the view showing a third manufacturing step.

(3) Step 3 (FIG. 12)

A device structure in FIG. 12 is formed through the steps in FIGS. 4(b) to 4(d), already described. That is, first, TiN/Ti film 217 (217a and 217b; the thickness of the Ti film: 15 nm, the thickness of the TiN film: 50 nm) is formed. At this time, narrow groove 239b in the protruding portion (see FIG. 11) is completely filled with TiN/Ti film 217b. On the other hand, wide groove 239a (see FIG. 11) is covered with TiN/Ti film 217a only at its bottom surface and sides. Tungsten (W) 212 (212a and 212b) is then deposited to a thickness of about 250 nm. The tungsten (W) film and TiN/Ti film are then consecutively flattened by CMP. This forms ground potential plug 100 and composite plug 104. A ground potential interconnection (ground interconnection) 260 is then formed on ground potential plug 100.

Figure 13:
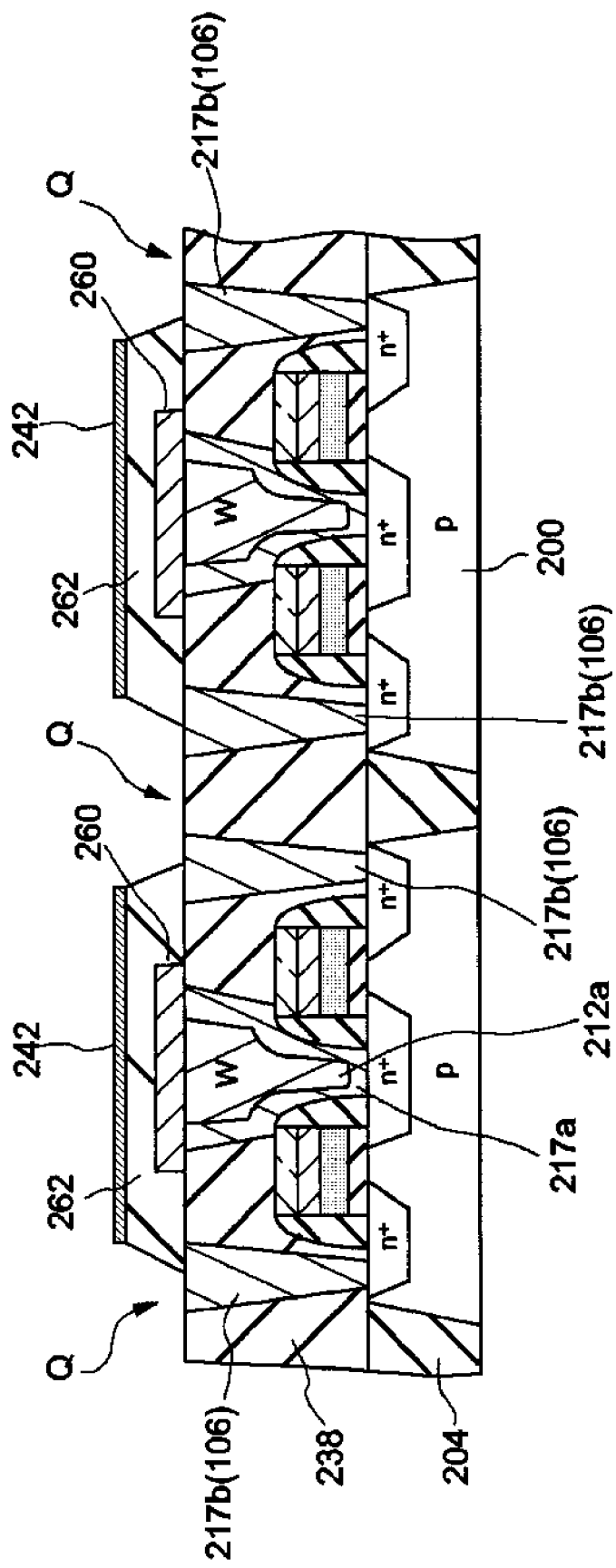
FIG. 13 is a cross-sectional view useful for describing the method for manufacturing the sectional structure of the device along line A-A in FIG. 9, the view showing a fourth manufacturing step.

(4) Step 4 (FIG. 13)

As shown in FIG. 13, a second insulating film (for example, an HDP (High Density Plasma) oxide film) 262 is formed. Subsequently, titanium (Ti) film 242 as an adhesion layer (thickness: about 1 nm) is formed and a resist mask is then formed. Consecutively, titanium (Ti) film 242 as an adhesion layer and second insulating film (HDP oxide film) 262 are patterned using the mask. This forms a connection area Q that is an opening formed by selectively removing second insulating film 262.

It should be noted that connection area (opening) Q strides over two adjacent first plugs 106 acting as heater electrodes; the two adjacent first plugs 106 correspond to the TiN layers of the TiN/TiN layers 217b filled in the narrow grooves. The connection area striding over the two adjacent heater electrodes inevitably forms a long opening pattern. This facilitates the formation of an opening pattern, a step of consecutively processing adhesion layer 242 and second insulating film 262, compared to the formation of a circle pattern, a small-area pattern that exposes only the top surface of one heater electrode. With a circular pattern, if significant misalignment occurs between the opening pattern and the heater electrode, it is likely to completely prevent the exposure of top surface of the heater electrode (inappropriate contact). In contract, with an elongate opening pattern, even if significant misalignment occurs between the opening pattern and the heater electrode in the longitudinal direction of the opening pattern, it is unlikely to completely prevent the exposure of top surface of the heater electrode (inappropriate contact) because the opening extends in the horizontal direction. Thus, a larger (mask) alignment margin can be provided for the formation of an opening pattern, which is thus facilitated.

Figure 14:
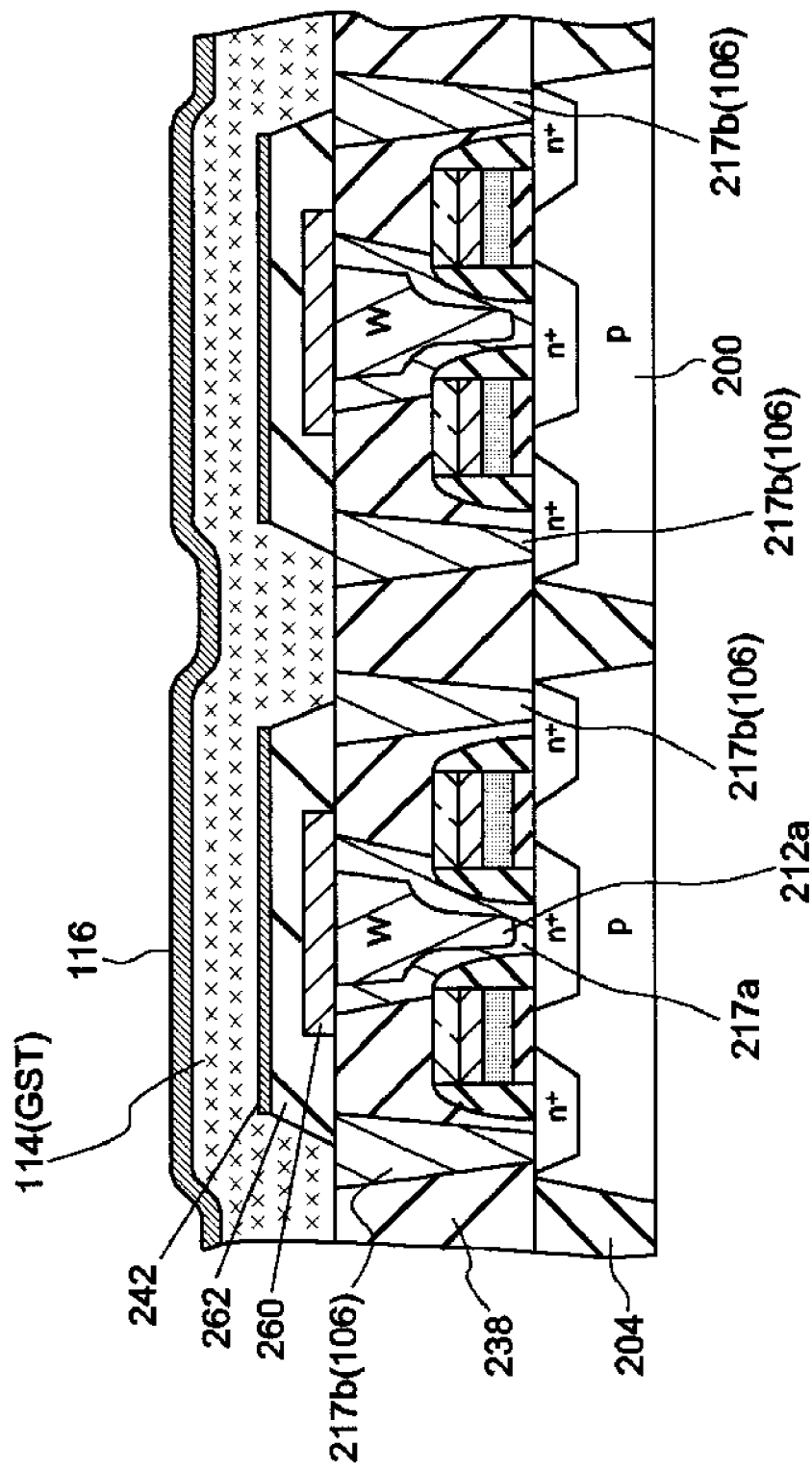
FIG. 14 is a cross-sectional view useful for describing the method for manufacturing the sectional structure of the device along line A-A in FIG. 9, the view showing a fifth manufacturing step.

(5) Step 5 (FIG. 14)

As shown in FIG. 14, GST film 114 as a phase change layer is formed. Upper electrode layer 116 consisting of tungsten (W) (thickness: 50 nm) is formed on GST film 114.

Figure 15:
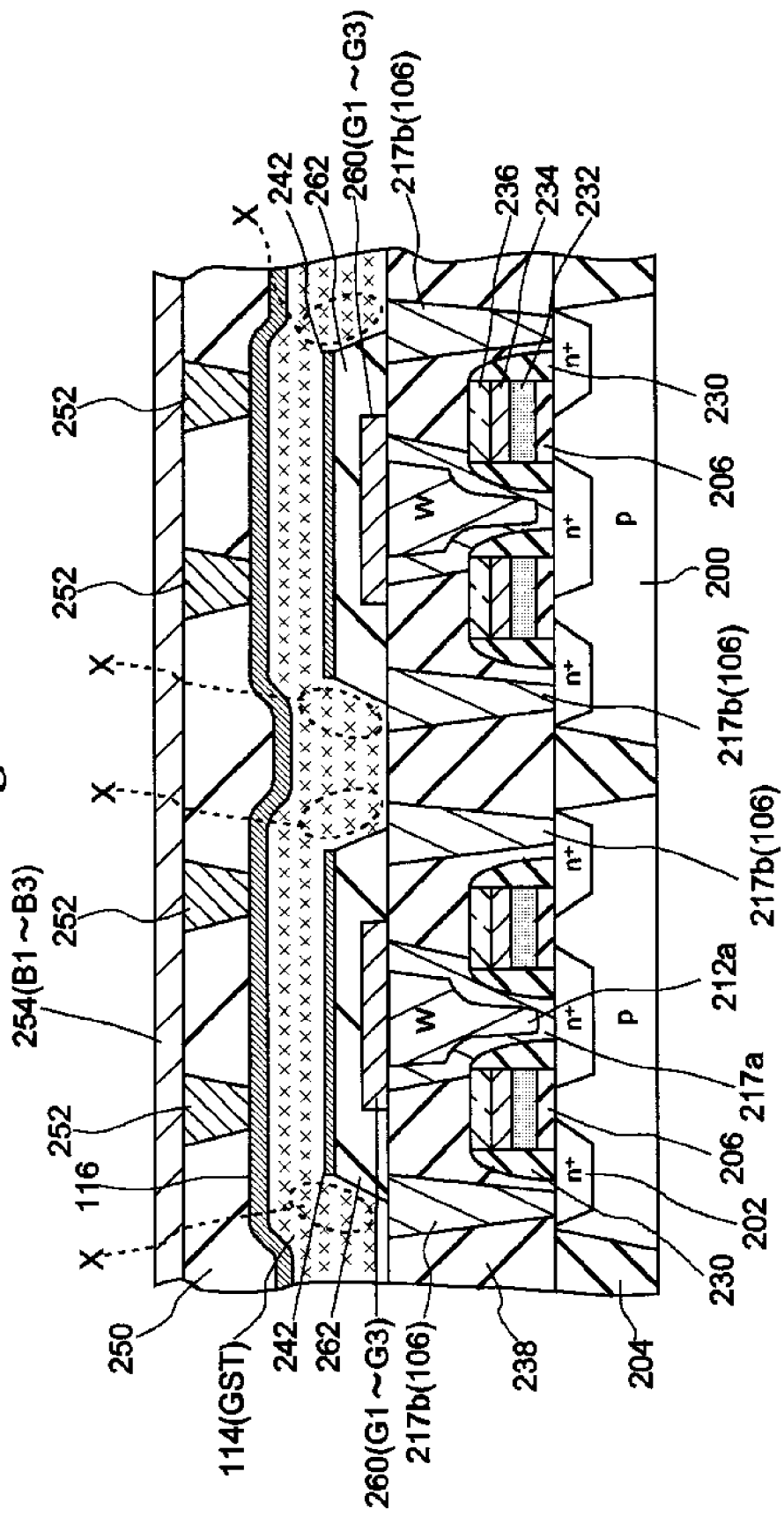
FIG. 15 is a cross-sectional view useful for describing the method for manufacturing the sectional structure of the device along line A-A in FIG. 9, the view showing a sixth manufacturing step.
Figure 16:
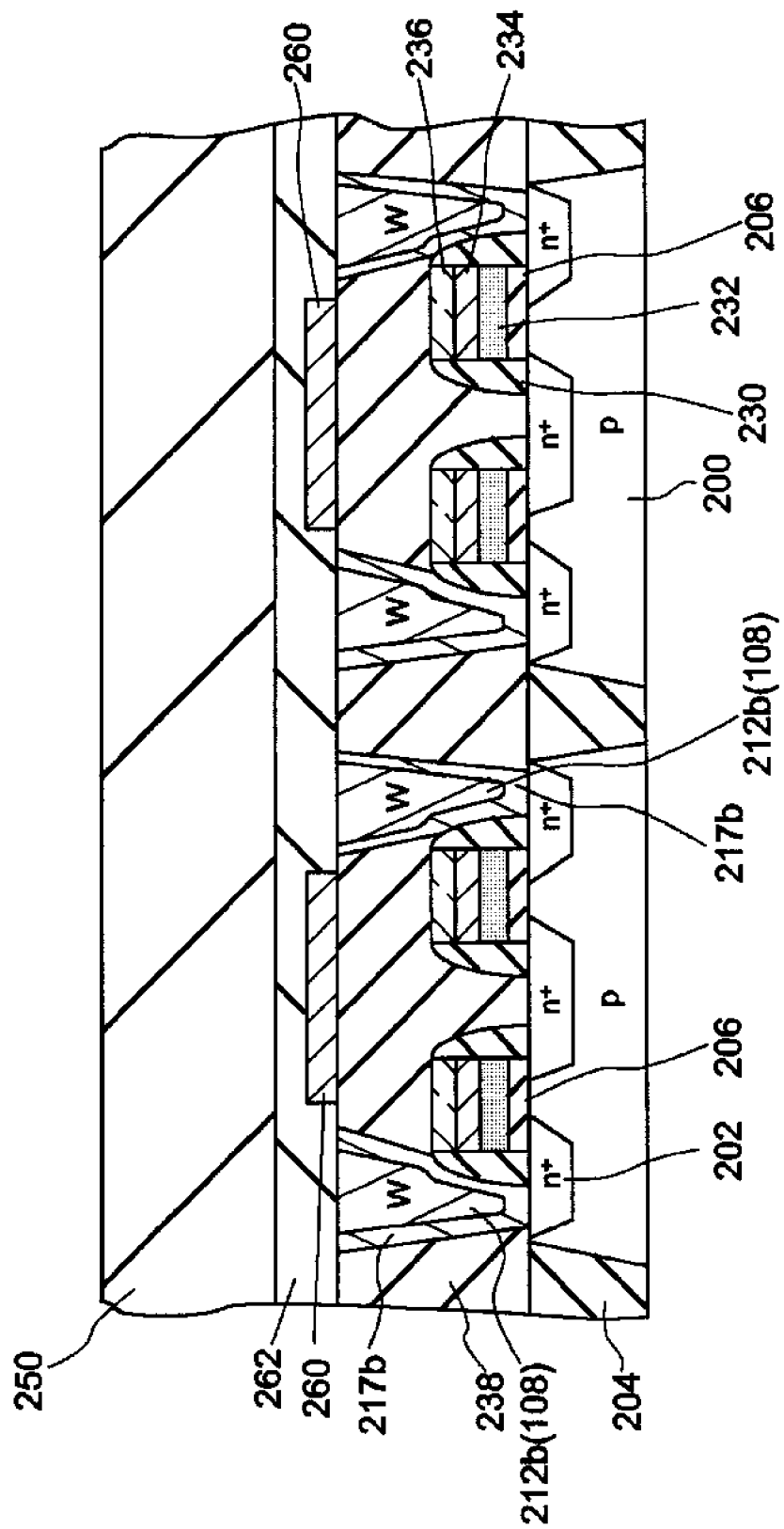
FIG. 16 is a cross-sectional view to show the structure of the device taken along line B-B in FIG. 9.

(6) Step 6 (FIG. 15)

As shown in FIG. 15, third interlayer insulating film 250 is formed. Second contact holes are then formed in a part of third interlayer insulating film 250, and contact plugs 252 are formed in second contact holes. Tungsten (W) layer 254 is subsequently deposited and patterned. Tungsten layer 254 constitutes bit lines B1 to B3 in the circuit in FIG. 6.

The phase change memory device (phase change memory IC) using a composite plug in accordance with the present invention is thus completed. In FIG. 15, areas X surrounded by dotted lines are areas in which a phase change occurs (phase change regions).

FIG. 16 is a sectional view of the device taken along line B-B in FIG. 9.

The sectional view taken along line B-B shows four NMOS transistors, four composite plugs, and the ground potential interconnection (ground interconnection) 260. The composite plug comprises tungsten layer 212b and TiN/Ti layer 217b as already described; tungsten layer 212b corresponds to second plug 108 in FIG. 1, and TiN layer constitutes first plug 106 in FIG. 1. Only second insulating film 262 and third interlayer insulating film 250 are formed in the upper half of the sectional structure.

Sixth Embodiment

Figure 17:
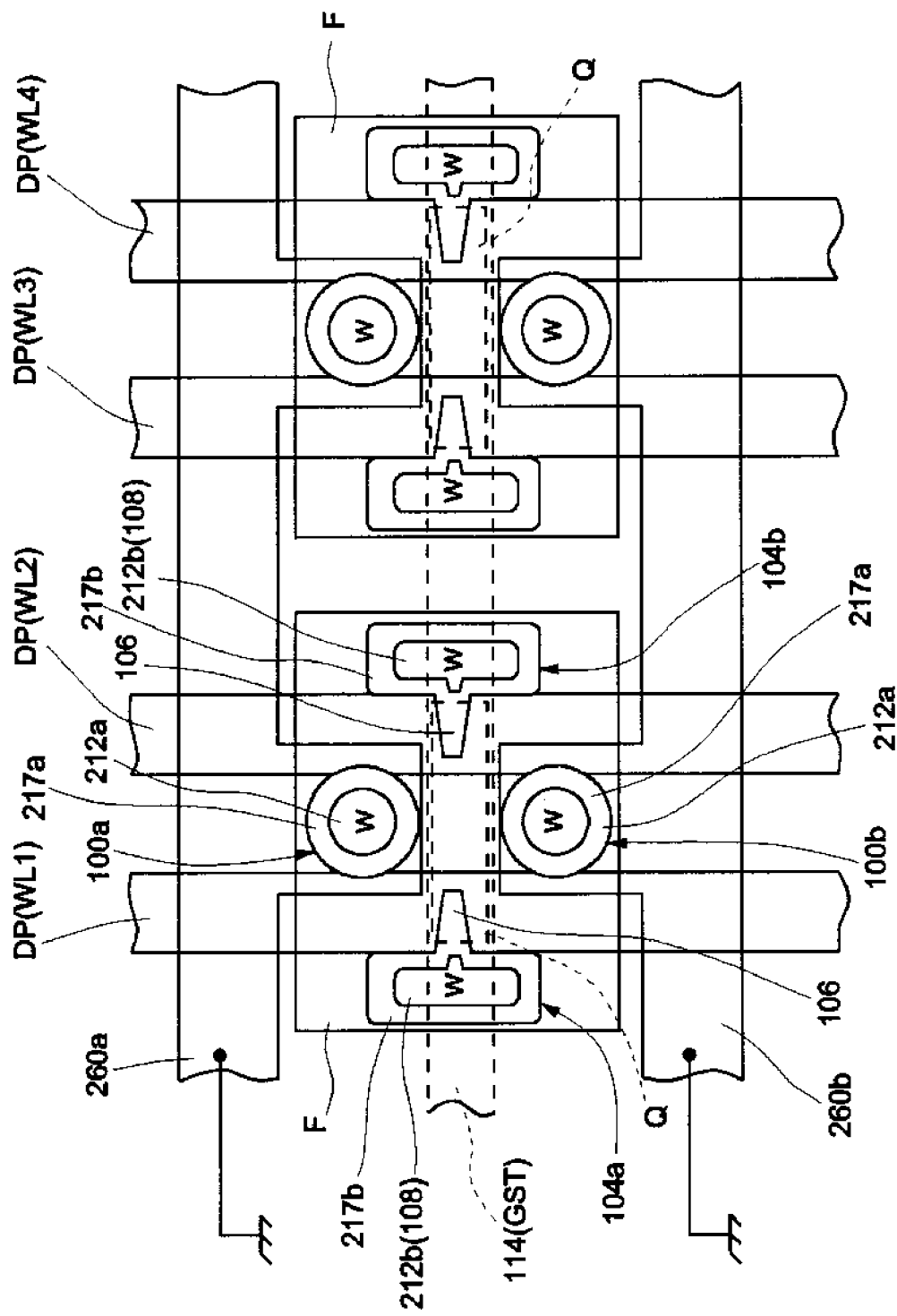
FIG. 17 is a plan view showing yet another example of layout of elements and interconnections in the memory cell area of the phase change memory device (phase change memory IC) shown in FIG. 6.

FIG. 17 is a plan view showing yet another example of layout of elements and interconnections in the memory cell area of the phase change memory device (phase change memory IC) shown in FIG. 6. In FIG. 17, the same components as those in FIGS. 7 and 9 are denoted by the same reference symbols.

In FIG. 17, two ground potential plugs 100a and 100b are disposed in one active region F, and two ground potential interconnections (ground interconnections) are correspondingly laid as shown by reference symbols 260a and 260b.

Further, in FIG. 17, projection-type (T-shaped (see FIG. 5(c)) composite plugs 104a and 104b are disposed in one active region F. In FIG. 17, the two adjacent ground potential plugs (100a and 100b) reduce the parasitic resistance of the ground line in the electronic circuit. This enables circuit operations to be stabilized.

Seventh Embodiment

In the present embodiment, description will be given of an example in which thermal efficiency is improved by adopting a structure having no electrode on the top surface of the phase change layer.

With the composite plug described in the above embodiments, second plug 108, acting as a contact plug, is present by the side of first plug 106, acting as a heater electrode. Heat generated by first plug 106 may escape to second plug 108 to slightly lower the thermal efficiency for a refresh operation, particularly for a reset operation.

A structure having no electrode on the top surface of the phase change layer is thus adopted to inhibit heat radiation from the top surface of the phase change layer. This makes it possible to sufficiently compensate for heat loss in the composite plug, enabling the prevention of a fall in thermal efficiency.

An electrode (reference symbol 116 in FIG. 1) present immediately above a phase change region of the phase change layer functions as heat sink to allow heat to escape; the phase change region is located in the vicinity of the interface between the first plug and the phase change layer. Accordingly, in this embodiment, no electrode is disposed on the top surface of the phase change layer. Further, a lead electrode layer is contacted with the bottom surface of the phase change layer at a position away from the interface between the first plug and the phase change layer. Furthermore, a second contact plug is connected to the lead electrode to form a current path through which a current is passed through the phase change layer.

Figure 18:
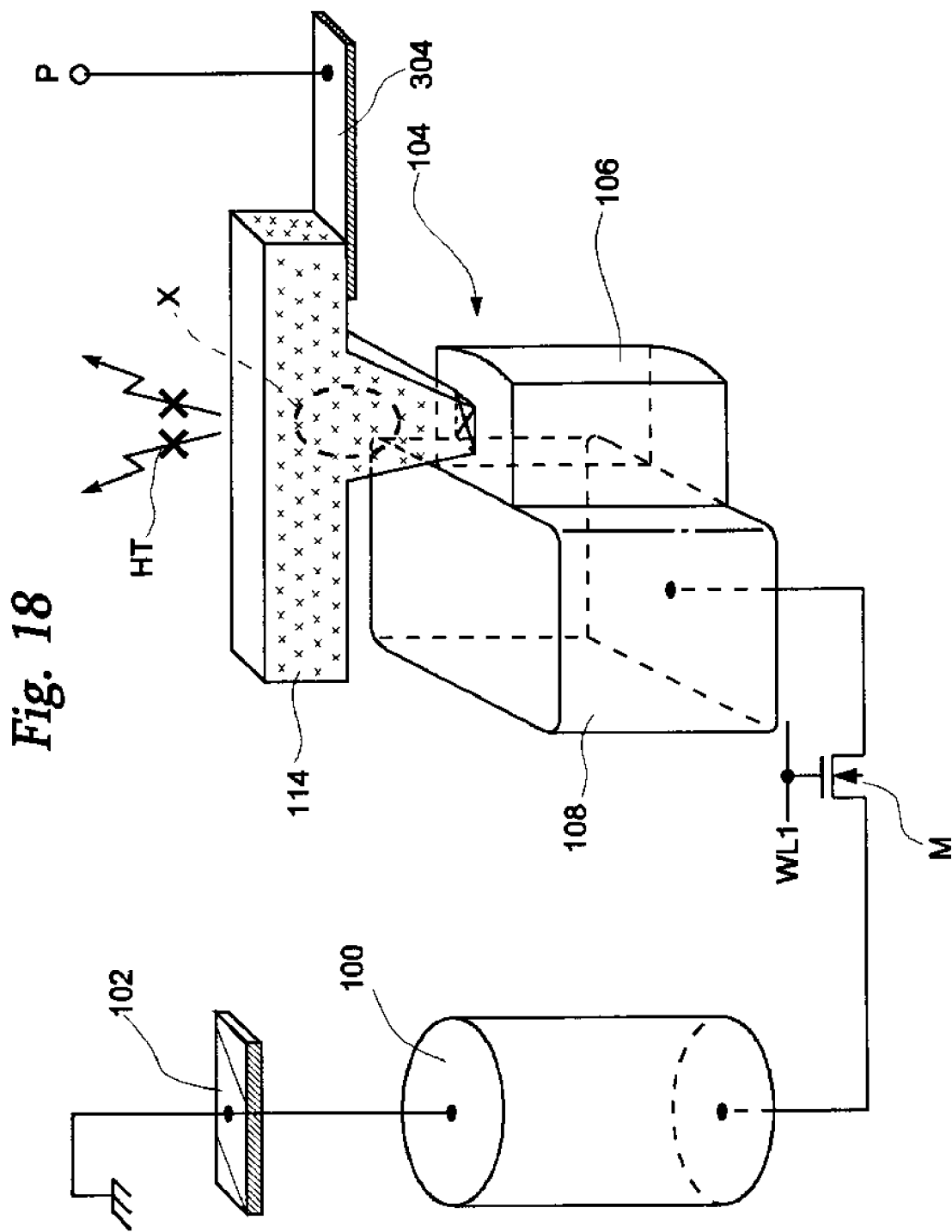
FIG. 18 is a diagram useful for describing the basic structure of an example of a phase change memory device in accordance with the present invention which adopts a structure having no electrode on a top surface of a phase change layer.

FIG. 18 is a diagram useful for describing the basic structure of an example of the phase change memory device in accordance with the present invention which adopts the structure having no electrode on the top surface of the phase change layer.

The configuration of the phase change memory device in FIG. 18 is the same as that of the phase change memory device in FIG. 1 except for the structure in which the electrode is connected to phase change layer 114. In FIG. 18, instead of upper electrode 116 shown in FIG. 1, lead electrode 304 is disposed on phase change layer 114. The electrode terminal P (second contact plug) is connected to a top surface of lead electrode 304.

The phase change region X is located in the vicinity of the interface between first plug 106, acting as a heater electrode, and phase change layer 114. Lead electrode 304 is in contact with a part of bottom surface of phase change layer 114 at a position away from the phase change region X. The second contact plug is connected to that part of top surface of the lead electrode that is not covered with phase change layer 114 and serves as electrode terminal P; in an actual IC, a bit line is connected to the second contact plug and corresponds to electrode terminal P.

As is apparent from FIG. 18, no electrode is present immediately above phase change regions X, which completely prevents heat (HT) radiation from the upper electrode 116 as shown in FIG. 1. In FIG. 18, X on the arrow HT indicating heat indicates no heat radiation. This improves the heat efficiency for a refresh operation, particularly for a reset operation.

That is, a possible heat loss in the electrode (composite plug 104) located under phase change layer 114 can be compensated for by modifying the connection of upper electrode 116 placed on phase change layer 114 in FIG. 1. This makes it possible to prevent a decrease in thermal efficiency.

Further, in the phase change memory device in accordance with the present embodiment, the bottom surface of phase change layer 114 is in contact with lead electrode layer (metal layer) 304. This improves the adhesion compared to the structure in which the phase change layer is in contact with the underlying insulating film.

Even if an adhesion layer (not shown in FIG. 18) consisting of a thin film of titanium (Ti) or the like is formed on lead electrode layer 304, the avoidance of contact with phase change region X prevents the disadvantageous coupling of components of lead electrode layer 304 and adhesion layer in phase change region X, which may vary the composition of the layers. This eliminates the adverse effect on the refresh characteristic. The present invention is also effective in reliably preventing the release of the phase change layer without affecting the refresh characteristic of the phase change memory device.

Further, the structure using the lead electrode in FIG. 18 enables the position of the second contact plug to be freely changed by altering the pattern of lead electrode layer 304. This effectively improves the degree of freedom of layout design.

Furthermore, lead electrode layer 304 is independent of phase change layer 114. Accordingly, during the step of forming lead electrode layer 304, interconnections and electrodes for peripheral circuits can be simultaneously formed. This is advantageous for manufacturing large-scale LSIs.

After an electrode is disposed on phase change layer 114, the following operation needs to be performed: an interlayer insulating film is disposed on the electrode, a contact hole is formed in the interlayer insulating film, a contact plug is buried in the contact hole, and the electrode terminal P is connected to the contact plug. During the formation of the contact hole, if the upper electrode layer (reference symbol 116 in FIG. 1) acting as an etching stopper is penetrated, phase change layer 114 may be exposed to cause line contamination. Gas emitted from phase change layer 114 may fill the contact hole to prevent the contact plug from being properly buried; such an accident is very unlikely to occur but the possibility is not zero. In contrast, the structure with lead electrode layer 304 in FIG. 18 is effective in solving the problems with the manufacturing process.

The formation of lead electrode layer 304 can be easily accomplished by a basic process technique for manufacturing a silicon-based LSI and does not require any special steps. This enables the phase change memory device in FIG. 18 to be easily mass-produced.

The phase change memory device in FIG. 18 is thus effective in compensating for heat loss in composite plug 104 to prevent a decrease in thermal efficiency. The phase change memory device in FIG. 18 also has many advantages; an adhesion layer can be easily formed, the manufacturing process involves no problem and can be executed simultaneously with the manufacture of peripheral circuits, and the layout design has a high degree of freedom. This is advantageous for the stable mass production of large-scale phase change memory ICs.

Figure 19:
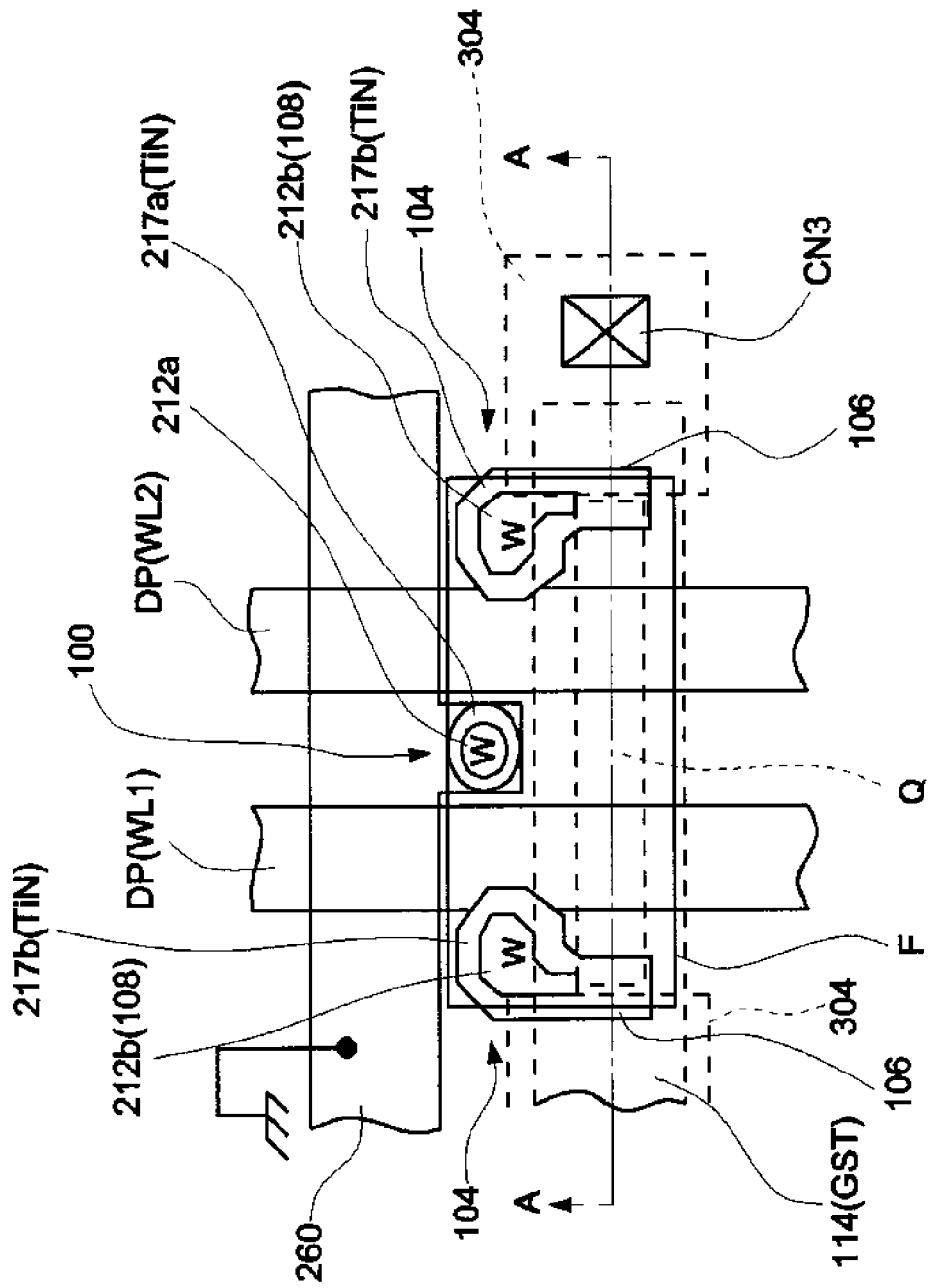
FIG. 19 is a plan view showing an example of layout of a memory cell portion of the phase change memory device adopting the structure (having no electrode on the top surface of the phase change layer) shown in FIG. 18.

FIG. 19 is a plan view of example of layout of a memory cell portion of a phase change memory device adopting the structure shown in FIG. 18 and having no electrode on the top surface of the phase change layer. Many of components of the layout shown in FIG. 19 are also included in the layout in FIG. 9 and are thus denoted by the same reference symbols.

In FIG. 19, reference symbol 100 denotes a ground potential plug. Reference symbol 104 denotes a composite plug. Composite plug 104 has a planar shape like the letter P (see FIG. 5(*a*)).

In FIG. 19, the area F is an active region. Two interconnections (DP) laid in the memory cell area in the vertical direction are doped silicon layers constituting the word lines (WL1 and WL2); these interconnections also serve as gate electrodes of MOS transistors.

In FIG. 19, GST film 114 as a phase change layer is disposed. Reference symbol Q denotes the connection area between first plug 106, acting as a heater electrode, and GST film 114; the connection area is an opening area formed by removing the second insulating film. Connection area Q strides over the two adjacent first plugs 106. This makes it possible to provide a larger alignment margin. This will be described below in detail. In FIG. 19, reference symbol 260 denotes a ground potential interconnection consisting of tungsten (W) for grounding ground potential plug 100; a ground potential interconnection is a ground interconnection corresponding to ground lines G1 to G3 at a circuit in FIG. 6.

Reference symbol 304 denotes a lead electrode layer connected to a part of bottom surface of phase change layer 114 (GST). Reference symbol CN3 denotes a second contact hole of which the second contact plug is connected to lead electrode layer 304.

Figure 20:
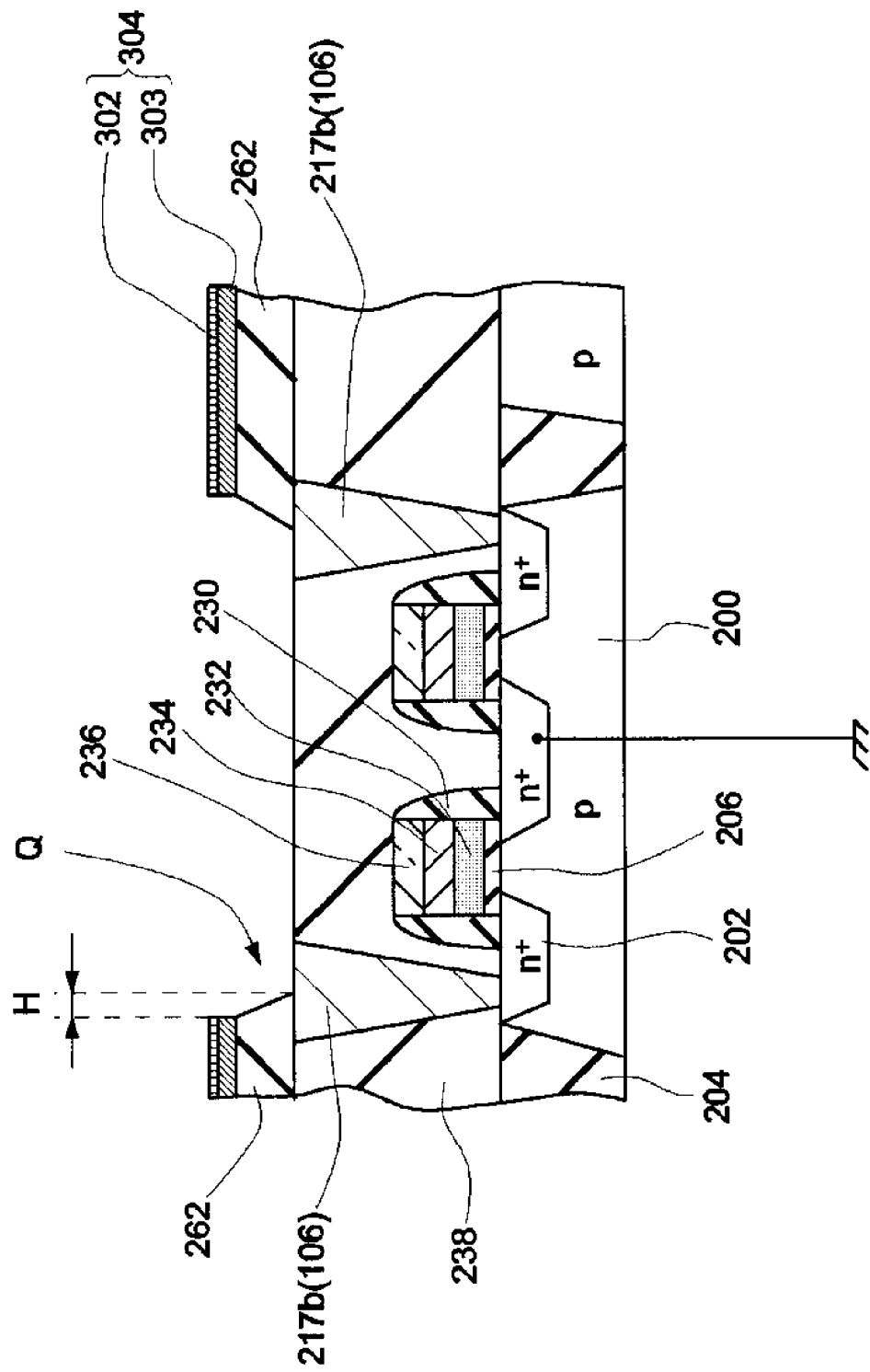
FIG. 20 is a cross-sectional view of the device taken along line A-A in FIG. 19, showing a step of manufacturing a lead electrode layer.
Figure 21:
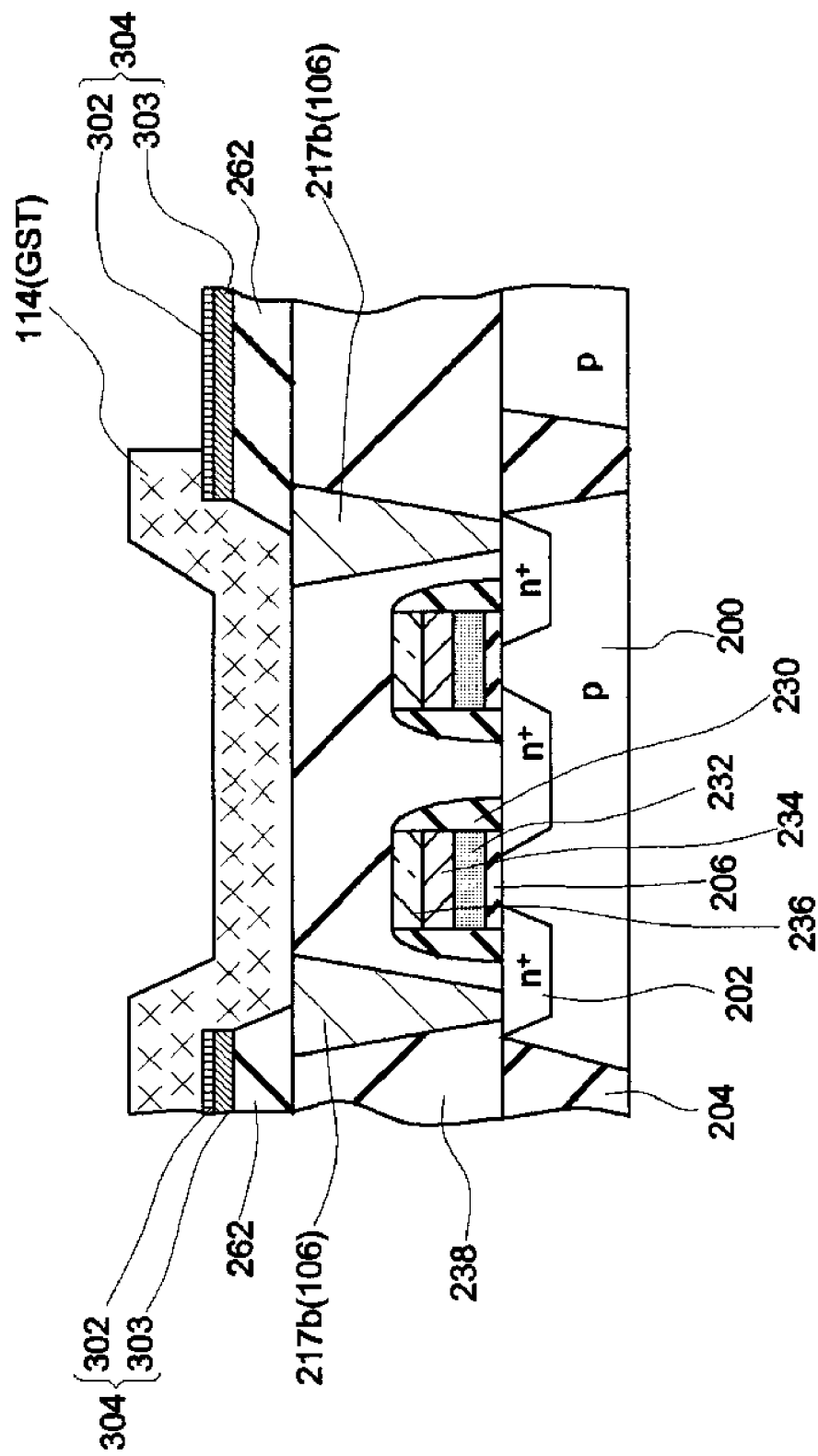
FIG. 21 is a cross-sectional view of the device taken along line A-A in FIG. 19, showing a step of manufacturing a phase change layer.
Figure 22:
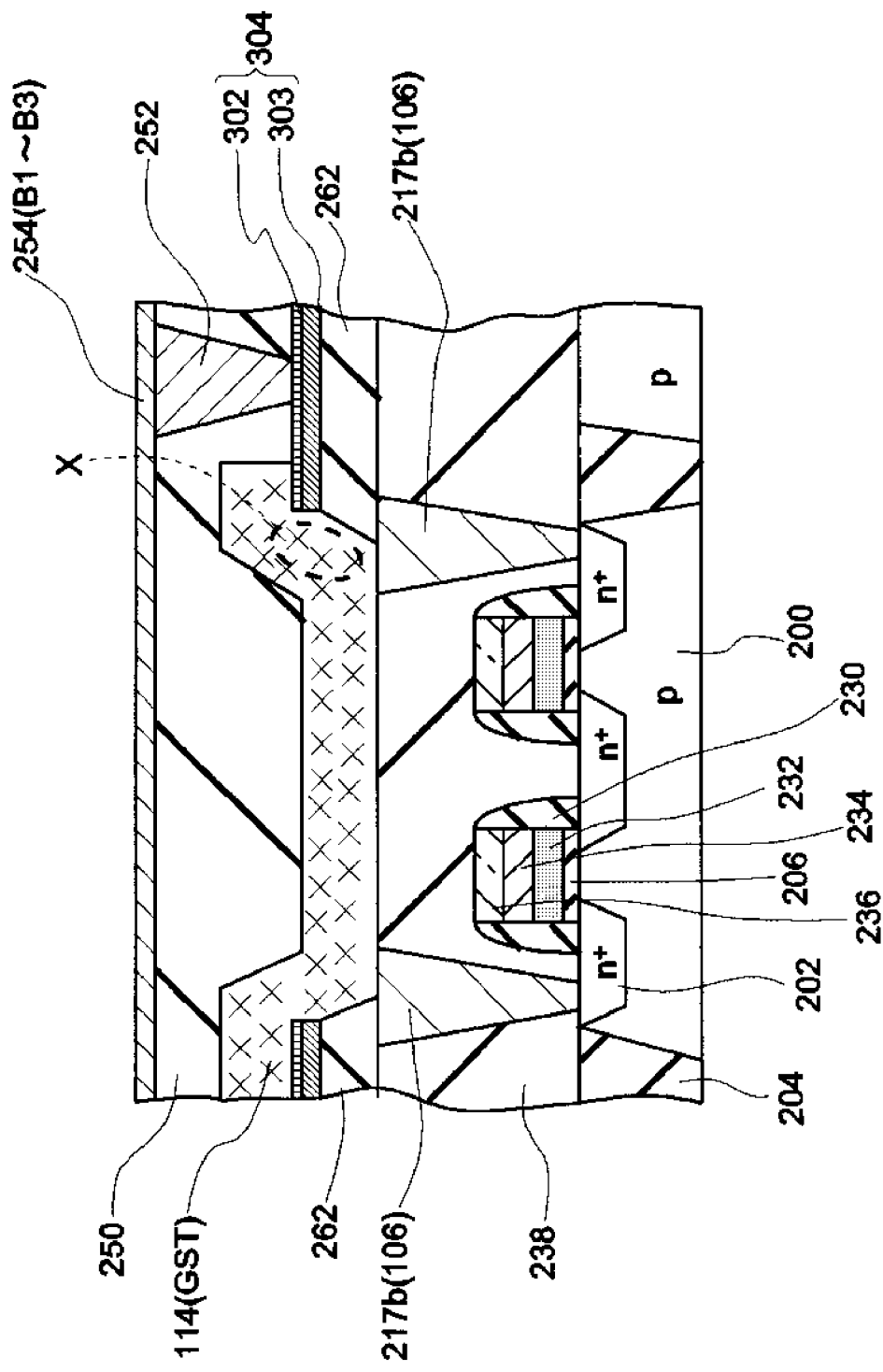
FIG. 22 is a cross-sectional view of the device taken along line A-A in FIG. 19, showing a step of manufacturing a bit line.
Figure 24A:
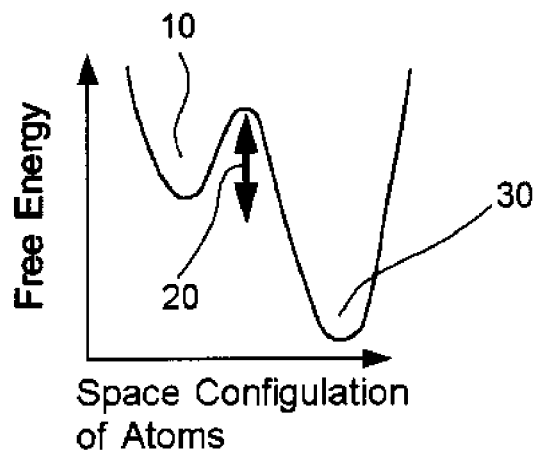
FIGS. 24(*a*) and 24(*b*) are diagrams useful for explaining the principle of the phase change memory.
Figure 24B:
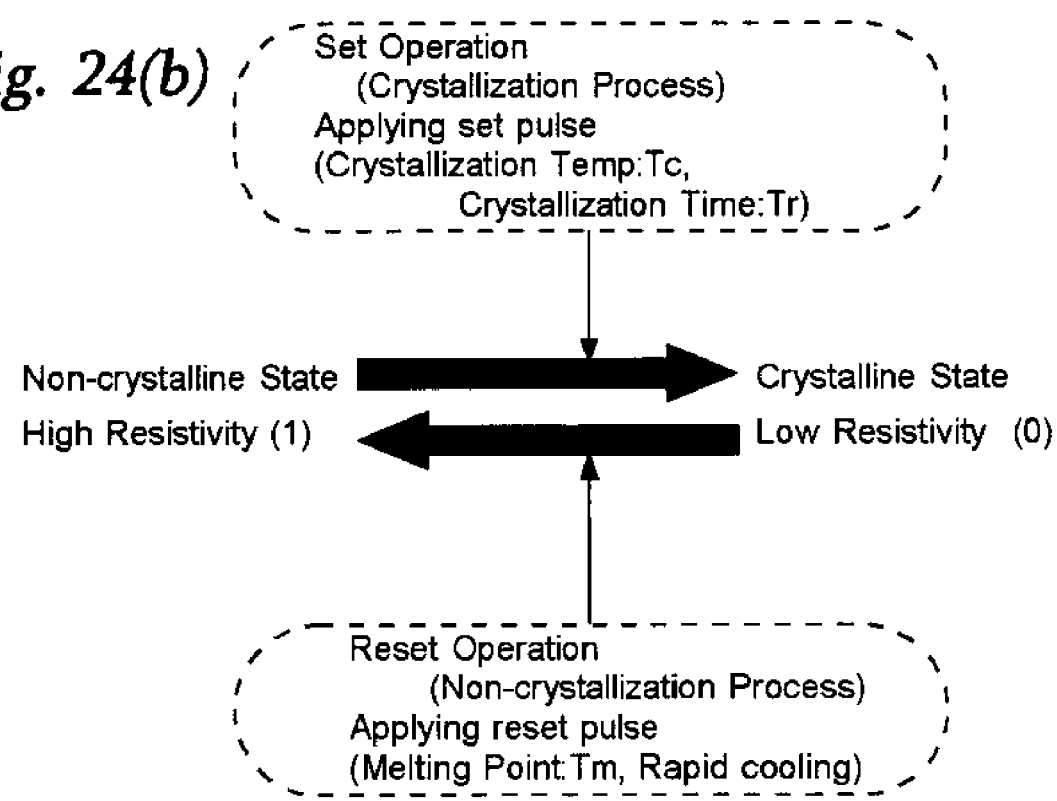
Figure 25A:
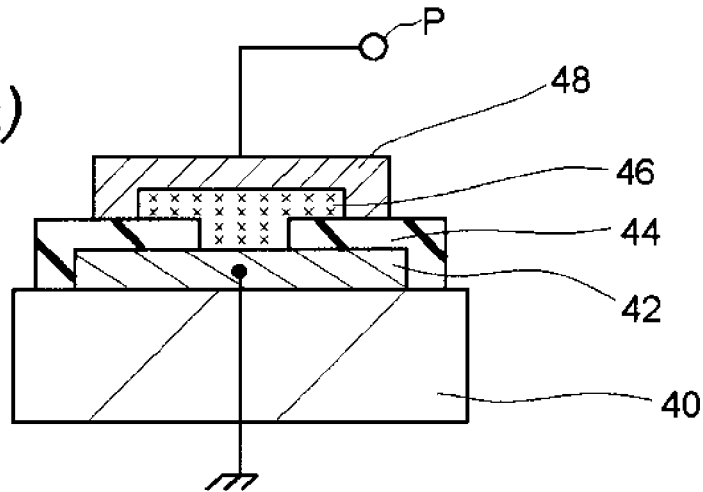
FIGS. 25(*a*) to 25(*d*) are diagrams useful for describing the basic structure as well as a set operation and a reset operation of the phase change memory device.
Figure 25B:
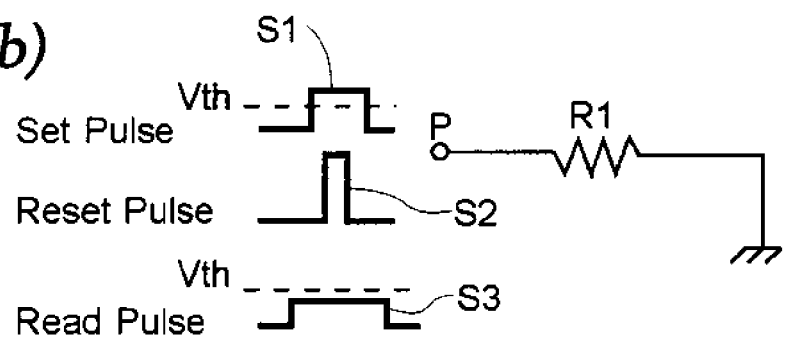
Figure 25C:
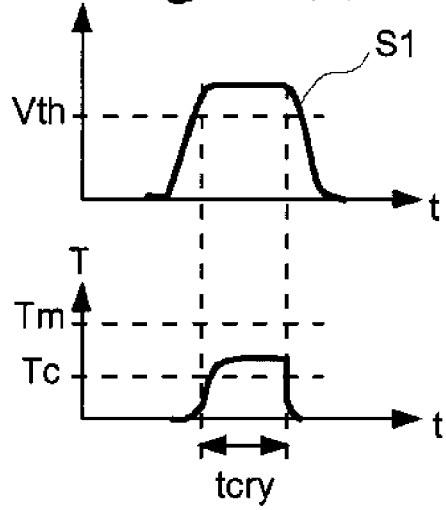
Figure 25D:
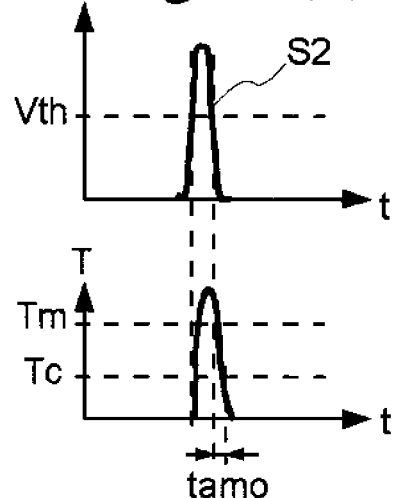

With reference to FIGS. 20 to 22, description will be given of a method for manufacturing a structure adopting a lead electrode such as the one shown in FIG. 19.

FIG. 20 is a cross-sectional view of the device taken along line A-A in FIG. 19, the view showing a process of manufacturing a lead electrode layer. FIG. 21 is a cross-sectional view of the device taken along line A-A in FIG. 19, the view showing a process of manufacturing a phase change layer. FIG. 22 is a cross-sectional view of the device taken along line A-A in FIG. 19, the view showing a process of manufacturing a bit line. In the figures, the same components as those in FIGS. 10 to 12 are denoted by the same reference symbols.

First, the manufacturing process shown in FIGS. 10 to 12 is performed, and then the process of manufacturing a lead electrode as shown in FIG. 20 is performed.

As shown in FIG. 20, an oxide film 262 (thickness: about 50 nm) is formed on first interlayer insulating film 238 by a plasma CVD method so as to cover first plug 106 (part of TiN/Ti layer 217*b*) of the composite plug, acting as a heater electrode. Lead electrode layer 304 is then formed; lead electrode layer 304 is composed of tungsten (W) layer 303 constituting a main electrode layer and adhesion layer 302 consisting of titanium (Ti). That is, tungsten (W) is deposited to form a layer 303 of thickness about 50 nm as the main electrode layer, and titanium (Ti) is deposited to form a layer 302 of thickness about 1 nm as the adhesion layer. A resist mask (not shown) is then formed, and titanium (Ti) layer 302 and tungsten (W) layer 303 are consecutively dry-etched using the resist mask. This forms lead electrode layer 304. The dry etching is consecutively executed to pattern the oxide film 262 to form an opening Q.

It should be noted that opening Q in oxide film 262 has an inclined (tapered) cross section. This allows an end of the processed lead electrode layer 304 to be automatically separated from an end of exposed surface of first plug 106 (TiN layer in the TiN/Ti layer 217*b*), acting as a heater electrode, by a predetermined distance "H" in the horizontal direction. This will be specifically described below.

The relationship between the position of first plug 106, acting as a heater electrode, and the end of the processed lead electrode layer 304 (Ti layer 302 and W layer 303) is very important. That is, lead electrode layer 304 (Ti layer 302 and W layer 303) must not hinder the proper contact between first plug 106 (TiN layer in the TiN/Ti layer 217*b*), acting as a heater electrode, and the phase change layer 114 (GST). However, when the end of lead electrode layer 304 (Ti layer 302 and W layer 303) is located too far away from the vicinity of the interface between first plug 106 (217*b*), acting as a heater electrode, and the phase change layer 114 (GST), the need for a reduction in memory cell size cannot be met. The method for manufacturing a phase change memory device in accordance with the present invention adopts what is called a self alignment technique for automatically determining the relative positions of the heater electrode and lead electrode.

When lead electrode layer 304 and oxide film 262 are consecutively etched using a common mask (not shown in FIG. 20), the higher etching rate of lead electrode layer 304 provides the processed part of lead electrode 304 with a substantially perpendicular cross section. On the other hand, the lower etching rate of oxide film 262 allows reaction products to adhere to oxide film 262 during etching, providing the processed part of the oxide film with a tapered (inclined) cross section. This separates the end of the interface between the heater electrode (first plug 106) and the phase change layer from the end of lead electrode layer 304 by the distance "H" by which the processed end surface of oxide film 262 projects in the horizontal direction so as to form an inclined surface. This automatically determines the relative positions of the end of lead electrode layer 304 and the interface between the heater electrode (first plug 106) and the phase change layer. As a result, positioning involves no problem, facilitating the manufacture of fine phase change memory elements.

It should also be noted that in the process in FIG. 20, the materials (302 and 303) of lead electrode layer 304 are patterned also in a peripheral circuit area, allowing electrodes and interconnections to be simultaneously formed. That is, lead electrode layer 304 is independent of phase change layer 114 (GST) in connection with the manufacturing process. Accordingly, during the formation of lead electrode layer 304 in the memory cell area, electrodes and interconnections can be simultaneously formed in the peripheral circuit area. This enables the same manufacturing process to be used for different operations, facilitating the manufacture of large-scale phase change memory ICs.

In the process in FIG. 21, phase change layer 114 (GST) of thickness, for example, about 100 nm is formed all over the surface of a semiconductor substrate by a sputtering method. A processing mask (not shown) is formed on phase change layer 114 (GST), which is then patterned using the processing mask. After the patterning, the processing mask is removed.

In the process in FIG. 22, third interlayer insulating film 250 is formed. A second contact hole is then formed in a part of third interlayer insulating film 250, and second contact plug 252 is formed in the second contact hole. Bit line 254 is formed which consists of tungsten (W) and which corresponds to B1 to B3 in FIG. 6. The area X encircled by a dotted line in FIG. 22 is a phase change region.

The present invention has been described with reference to the embodiments. However, the present invention is not limited to these embodiments. Many variations and applications are possible within the scope of the present invention.

Figure 26:
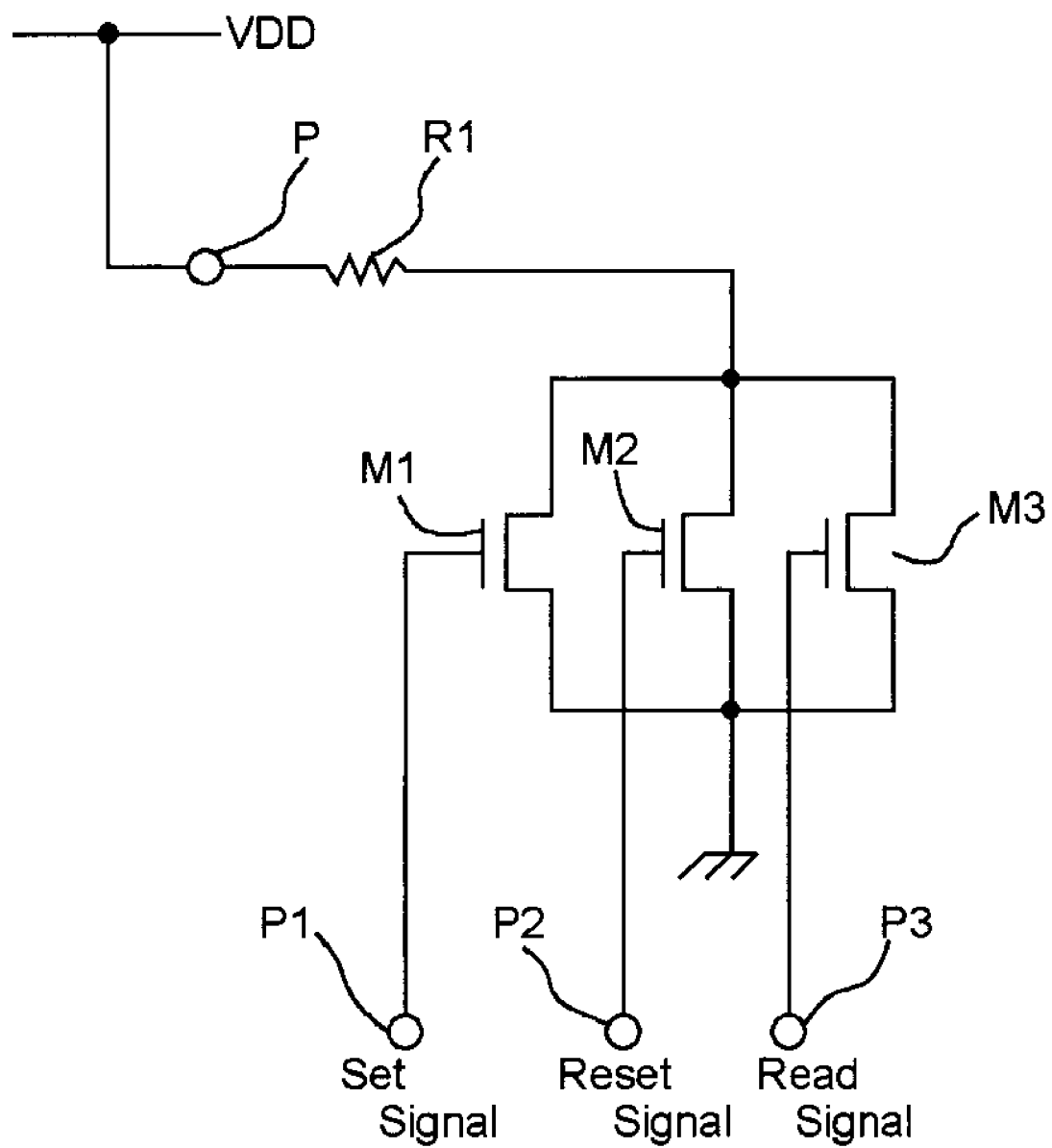
FIG. 26 is a circuit diagram showing an example of a circuit scheme for the phase change memory device.
Figure 27:
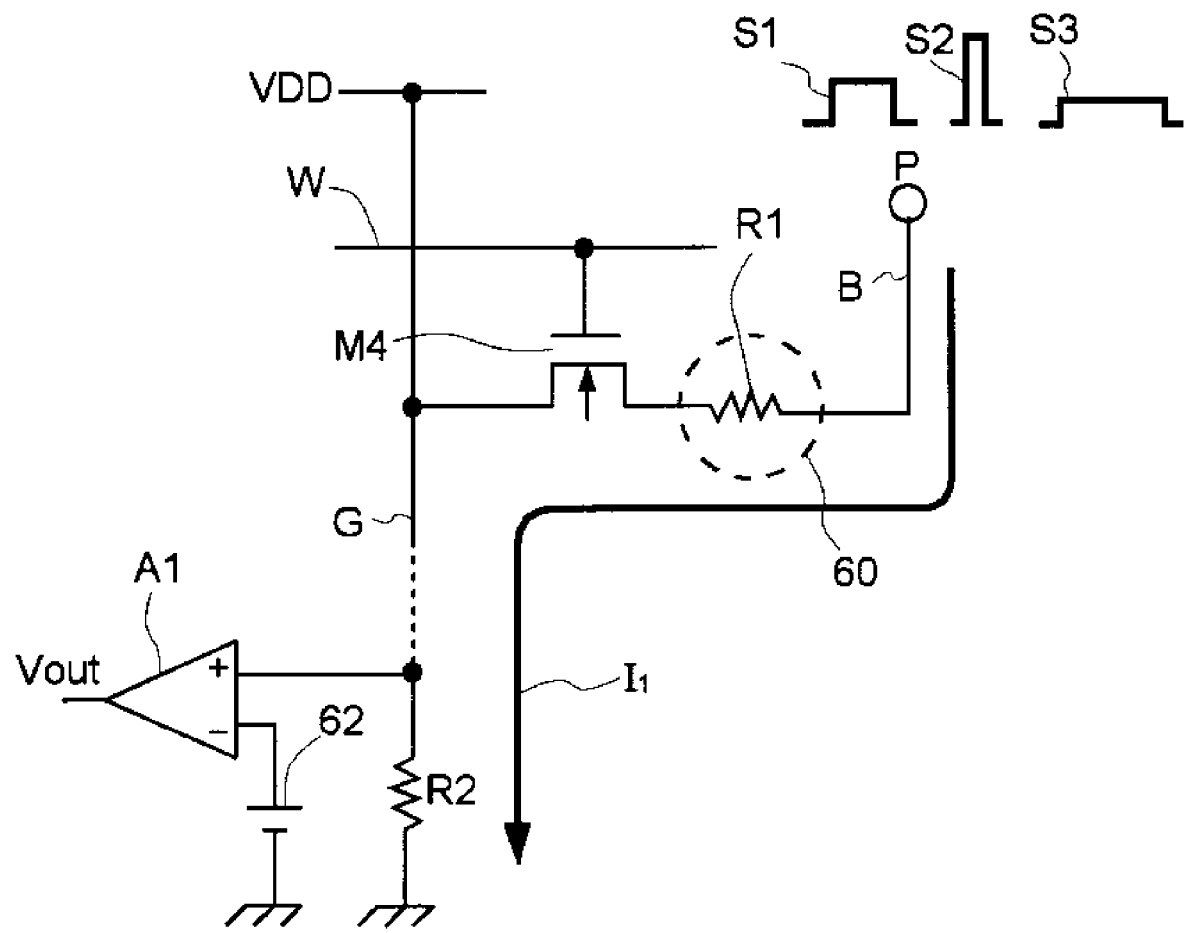
FIG. 27 is a circuit diagram useful for describing a read operation in the phase change memory device (phase change memory IC)
Figure 28A:
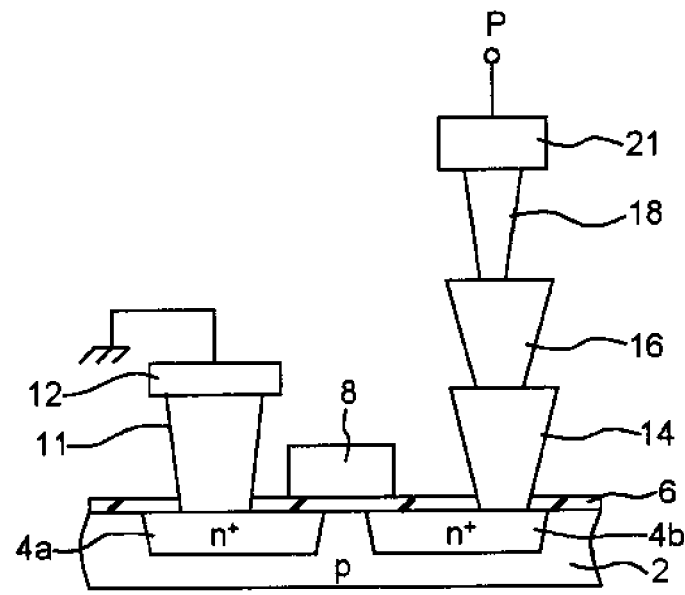
FIGS. 28(*a*) and 28(*b*) are cross-sectional views showing an example of conventional structure of the memory cell portion of the phase change memory device (phase change memory IC).
Figure 28B:
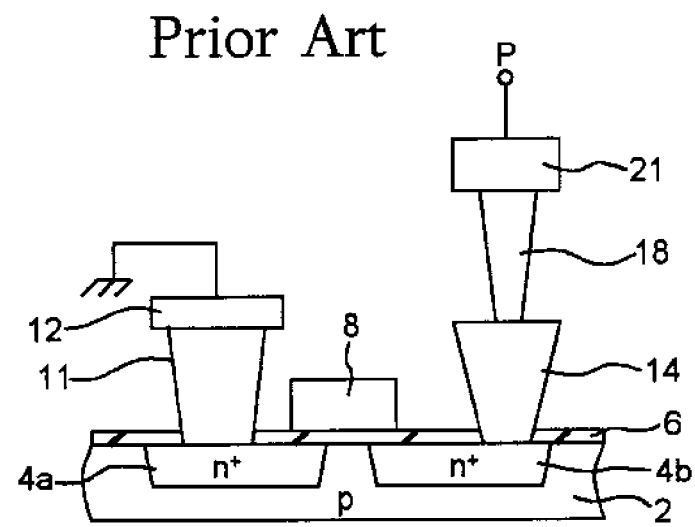

For example, a switching device such as a bipolar transistor, a PN junction diode, or a Schottky barrier diode may be used instead of the MOS transistor constituting a memory cell. A material other than the chalcogenide semiconductor may be used as a phase change layer. Such a circuit scheme as shown in FIG. 26 may be used for the phase change memory IC; instead of inputting pulses of different waveforms, this circuit scheme selectively energize transistors of different sizes to draw a current.

As described above, a heater electrode is conventionally stacked on a contact plug, unavoidably resulting in a multilayer structure. However, the present invention uses a composite plug to enable the contact plug and heater electrode (heater plug) to be disposed in the same contact hole. This provides the structure in which the contact plug and heater electrode are formed into a single layer. This in turn simplifies the process of manufacturing a phase change memory device and reduces the size of the phase change memory device.

Increasing the volume of the second plug, constituting the composite plug, makes it possible to reduce the resistance of the composite contact plug as a whole.

The composite plug can be easily formed by changing a mask pattern used to form a contact hole in the interlayer insulating film, to form a contact hole shaped to have a wide main body portion and a narrow protruding portion and consecutively filling the contact hole with different types of materials (for example, TiN and W) with the thickness of the resulting film adjusted; the contact hole is, for example, P or L shaped or shaped like a projection. This is advantageous for the mass production of phase change memories.

When the second plug, consisting of a highly conductive material, has a larger volume than the first plug, the electric resistance of the composite plug is dominantly determined by the second plug. This makes it possible to reduce the resistance value of the composite plug as a whole without affecting the operation of the circuit.

Preferably, there is a difference of about 10 times in resistivity between the first conductive material and the second conductive material. Such a difference can be substantially realized by using, for example, titanium nitride (TiN) as a first conductive material and tungsten (W) as a second conductive material. Thus, the difference does not limit the selection of materials.

The present invention can also improve thermal efficiency by adopting a structure having no electrode on the top surface of the phase change layer and in which the lead electrode is contacted with the phase change layer. With the composite plug, the second conductive material acting as a contact plug is present by the side of the first plug acting as a heater electrode. Heat generated by the first plug thus escapes to the second plug. This may slightly lower the thermal efficiency for a write operation, particularly for a reset operation. The structure having no electrode acting as a heat sink on the top surface of the phase change layer is thus adopted to inhibit heat radiation from the top surface of the phase change layer. This makes it possible to sufficiently compensate for heat loss in the composite plug, enabling the prevention of a fall in thermal efficiency.

To adopt the structure having no electrode on the top surface of the phase change layer, the lead electrode is contacted with the bottom surface of the phase change layer at a position away from the interface between the first plug and the phase change layer. The contact plug is then connected to the lead electrode to form a current path through which a current is passed through the phase change layer. This structure can be manufactured by an ordinary LSI manufacturing process without posing any problem.

The adhesion between the phase change layer and the lead electrode layer can be improved by providing an adhesion layer (titanium (Ti) or the like) on the main electrode layer (for example, a metal layer of tungsten (W)), a component of the lead electrode layer. The adhesion layer does not contact the phase change layer, in which a phase change occurs. This advantageously prevents the possible degradation of a refresh characteristic resulting from composition variations caused by the coupling of the components of the phase change layer and lead electrode layer in the phase changing area.

According to the present invention, adjustment of the planar pattern of the contact hole, the width of the groove, and the thicknesses of the thin films of the first and second conductive materials allows the composite plug to be easily formed simply by using a technique for filling the contact hole (CVD or the like).

The present invention is also able to manufacture large-scale phase change memory devices using a general-purpose manufacturing technique without the need to provide a special manufacturing process; the large-scale phase change memory device is a phase change memory IC having a switching element for memory cell selection, a composite plug, a heater electrode, a phase change layer, and an electrode formed on the top surface of the phase change layer or a lead electrode and a contact plug connected to the lead electrode.

The manufacturing steps can be reduced by simultaneously forming a composite plug and a ground potential plug during the same manufacturing process.

Using no special technique but only a general-purpose semiconductor manufacturing technique, the present invention can minimize the layer structure of each memory cell in the phase change memory device to achieve a reduction in the size of the phase change memory device, simplification of the structure, and a reduction in manufacturing steps. The present invention further inhibits heat radiation from the upper electrode on the phase change layer to improve thermal efficiency as required. This enables the mass production of large-scale phase change memory devices.

The present invention uses the composite plug to exert the following effect: the layer structure of each memory cell in the phase change memory device is minimized to achieve a reduction in the size of the phase change memory device, simplification of the structure, and a reduction in manufacturing steps, enabling the mass production of large-scale phase change memory devices. The present invention is therefore useful as a phase change memory device (phase change memory LSI) using a chalcogenide phase change film, a method for manufacturing a composite plug, and a method for manufacturing a phase change memory device.

What is claimed is:

1. A phase change memory device comprising:
   a current path comprising:
      a conductor layer;
      a first contact plug connected to the conductor layer;
      a heater electrode connected to the contact plug; and
      a phase change layer connected to the heater electrode so as to generate Joule heat at an interface between the phase change layer and the heater electrode to change a phase of the phase change layer to write information;
   a first interlayer insulating film in which a first contact hole is formed; and
   a composite plug buried in the first contact hole, wherein the composite plug comprises:
      a first plug comprising a first conductive material and acting as the heater electrode; and
      a second plug comprising a second conductive material having a lower resistivity than the first conductive material and acting as the first contact plug,
   wherein a current is passed through the current path.

2. The phase change memory device according to claim 1, wherein the first conductive material comprises a metal selected from titanium (Ti), tantalum (Ta), molybdenum (Mo), niobium (Nb), zirconium (Zr), and tungsten (W), or a nitride of the metal, or a silicide of the metal.

3. The phase change memory device according to claim 1, wherein the first conductive material comprises any of titanium nitride (TiN), tantalum nitride (TaN), molybdenum nitride (MoN), niobium nitride, titanium-silicon nitride, titanium-aluminum nitride, titanium-boron nitride, zirconium-silicon nitride, tungsten-silicon nitride, tungsten-boron nitride, zirconium-aluminum nitride, molybdenum-silicon nitride, molybdenum-aluminum nitride, tantalum-silicon nitride, tantalum-aluminum-nitride, titanium oxynitride, titanium aluminum oxynitride, tungsten oxynitride, tantalum oxynitride, tantalum silicide (TaSi), tungsten silicide (WSi), or molybdenum silicide (MoSi).

4. The phase change memory device according to claim 1, wherein the second conductive material comprises a metal selected from tungsten (W), aluminum (Al), molybdenum (Mo), and copper (Cu), or a silicide of the metal.

5. The phase change memory device according to claim 1, wherein the resistivity of the first conductive material is at least 10 times as high as that of the second conductive material.

6. The phase change memory device according to claim 1, wherein the volume of the second plug is larger than that of the first plug.

7. The phase change memory device according to claim 1, wherein a planar shape of the composite plug comprises:
   a main body portion including the second plug; and
   a protruding portion which protrudes from the main body portion and which has a narrower width than that of the main body portion, and which comprises the first plug.

8. The phase change memory device according to claim 7, wherein the planar shape of the composite plug is like a letter P, a letter L, or an inverted letter T.

9. The phase change memory device according to claim 1, wherein the first plug is formed by burying titanium nitride (TiN) on a thin titanium (Ti) film formed at sidewalls and bottom of the first contact hole put in the first interlayer insulating film, and the second plug is formed by filling tungsten (W) into a recessed portion remaining after burying the titanium nitride (TiN).

10. The phase change memory device according to claim 1, wherein a bottom surface of the phase change layer is in contact with a top surface of the first plug acting as the heater electrode in the composite plug, a lead electrode layer is disposed in contact with the bottom surface of the phase change layer at a position away from the interface between the first plug and the phase change layer, and a second contact plug is connected to the lead electrode layer, so that the second contact plug, the phase change layer, the first plug acting as the heater electrode, the second plug acting as the first contact plug, and the conductor layer form a current path.

11. The phase change memory device according to claim 10, wherein a second insulating film patterned so as to expose at least a part of the first plug of the composite plug is formed on the first interlayer insulating film in which the composite plug is buried,
   the lead electrode layer with a predetermined pattern is formed on the second insulating film,
   the phase change layer is formed so as to cover a part of the lead electrode layer and the exposed first plug,
   a third interlayer insulating film is formed on the phase change layer, the third interlayer insulating film having a second contact hole exposing that part of a top surface of the lead electrode layer which is not covered with the phase change layer, and
   the second contact plug connected to the lead electrode layer is formed in the second contact hole.

12. The phase change memory device according to claim 11, wherein the lead electrode layer comprises a main electrode layer and an adhesion layer formed on a surface of the main electrode layer to improve adhesion to the phase change layer.

13. The phase change memory device according to claim 1, further comprising a switching device for memory cell selection which is electrically connected to the second plug of the composite plug.

14. A method for manufacturing the composite plug according to claim 1, the method comprising:
   a first step of selectively patterning a part of a first interlayer insulating film on a semiconductor substrate to form a first contact hole with a planar shape having a main body portion and a protruding portion which protrudes from the main body portion and which has a narrower width than that of the main body portion;
   a second step of burying the first contact hole with a first conductive material under conditions that allow only the protruding portion to be completely filled and a recess to be remained in the main body portion, to form the first plug acting as a heater electrode; and a third step of burying the recess of the main body potion of the first contact hole with a second conductive material to form the second plug.

15. A method for manufacturing the phase change memory device according to claim 1, the method comprising:

a step A of forming a composite plug in a first contact hole in a first interlayer insulating film using the method for manufacturing a composite plug, the method comprising:

a first step of selectively patterning a part of the first interlayer insulating film on a semiconductor substrate to form the first contact hole with a planar shape having a main body portion and a protruding portion which protrudes from the main body portion and which has a narrower width than that of the main body portion;

a second step of burying the first contact hole with a first conductive material under conditions that allow only the protruding portion to be completely filled and a recess to be remained in the main body portion, to form the first plug acting as a heater electrode; and a third step of burying the recess of the main body potion of the first contact hole with a second conductive material to form the second plug, and a step B of forming the phase change layer so that a bottom surface of the phase change layer contacts the first plug of the composite plug.

16. A method for manufacturing the phase change memory device according to claim 10, the method comprising:

a step A of forming a composite plug in a first contact hole in a first interlayer insulating film using the method for manufacturing a composite plug, the method comprising:

a first step of selectively patterning a part of the first interlayer insulating film on a semiconductor substrate to form the first contact hole with a planar shape having a main body portion and a protruding portion which protrudes from the main body portion and which has a narrower width than that of the main body portion;

a second step of burying the first contact hole with a first conductive material under conditions that allow only the protruding portion to be completely filled and a recess to be remained in the main body portion, to form the first plug acting as a heater electrode; and a third step of burying the recess of the main body potion of the first contact hole with a second conductive material to form the second plug;

a step B of forming a second insulating film on the first interlayer insulating film in which the composite plug is buried;

a step C of forming a lead electrode layer on the second insulating film at a predetermined position;

a step D of patterning the second insulating film so as to expose at least a part of the first plug of the composite plug;

a step E of forming the phase change layer so as to cover a part of the lead electrode layer and the exposed first plug;

a step F of forming a third interlayer insulating film on the phase change layer and patterning the third interlayer insulating film to form a second contact hole exposing that part of a top surface of the lead electrode layer which is not covered with the phase change layer; and a step G of burying a second contact plug in the second contact hole.

17. The method for manufacturing a phase change memory device according to claim 15 or 16, further comprising, before the first step of forming the composite plug, a step of forming a switching device for memory cell selection, wherein during the first step of forming the composite plug, a ground potential plug is formed for setting one electrode of the switching element to the ground potential.

18. The phase change memory device according to claim 1, wherein the first plug is adjacent to the second plug.

19. The phase change memory device according to claim 1, wherein at least a portion of the second plug is disposed at an interior side of the first plug.

20. The phase change memory device according to claim 1, wherein at least a portion of the first plug is disposed along a perimeter of the second plug.

21. A phase change memory device comprising:

an insulating layer formed over a substrate, the insulating layer having a substantially planar surface;

a hole selectively formed in the insulating layer;

a composite plug filling the contact hole substantially to a level of the planar surface of the insulating layer, the composite plug thereby having an upper surface that is substantially coplanar with the planar surface of the insulating layer, the composite plug further having a first plug which constitutes a part of the composite plug to form a first portion of the upper surface of the composite plug and a second plug which constitutes another part of the composite plug to form a second portion of the upper surface of the composite plug, the first plug being smaller in resistivity than the second plug;

a phase change layer formed in contact with the first portion of the upper surface of the composite plug apart from the second portion of the upper surface of the composite plug; and a conductive layer formed in contact with the phase change layer.

22. The phase change memory device according to claim 21, wherein the first plug comprises a first conductive material, and wherein the first conductive material comprises a metal selected from titanium (Ti), tantalum (Ta), molybdenum (Mo), niobium (Nb), zirconium (Zr), and tungsten (W), or a nitride of the metal, or a silicide of the metal.

23. The phase change memory device according to claim 21, wherein the first plug comprises a first conductive material, and wherein the first conductive material comprises any of titanium nitride (TiN), tantalum nitride (TaN), molybdenum nitride (MoN), niobium nitride, titanium-silicon nitride, titanium-aluminum nitride, titanium-boron nitride, zirconium-silicon nitride, tungsten-silicon nitride, tungsten-boron nitride, zirconium-aluminum nitride, molybdenum-silicon nitride, molybdenum-aluminum nitride, tantalum-silicon nitride, tantalum-aluminum-nitride, titanium oxynitride, titanium aluminum oxynitride, tungsten oxynitride, tantalum oxynitride, tantalum silicide (TaSi), tungsten silicide (WSi), or molybdenum silicide (MoSi).

24. The phase change memory device according to claim 21, wherein the first plug comprises a first conductive material, wherein the second plug comprises a second conductive material, and wherein the second conductive material comprises a metal selected from tungsten (W), aluminum (Al), molybdenum (Mo), and copper (Cu), or a silicide of the metal.

25. The phase change memory device according to claim 21, wherein the first plug comprises a first conductive material, wherein the second plug comprises a second conductive material, and wherein the resistivity of the first conductive material is at least 10 times as high as that of the second conductive material.

26. The phase change memory device according to claim 21, wherein the volume of the second plug is larger than that of the first plug.

* * * * *